(12) United States Patent
Oki et al.

(10) Patent No.: US 6,898,166 B2
(45) Date of Patent: May 24, 2005

(54) SYNCHRONOUS SIGNAL GENERATING METHOD, RECORDING APPARATUS, TRANSMITTING APPARATUS, RECORDING MEDIUM, AND TRANSMISSION MEDIUM

(75) Inventors: Tsuyoshi Oki, Kanagawa-ken (JP); Atsushi Hayami, Kanagawa-ken (JP)

(73) Assignee: Victor Company of Japan, Limited, Yokohama (JP)

( * ) Notice: Subject to any disclaimer, the term of this patent is extended or adjusted under 35 U.S.C. 154(b) by 476 days.

(21) Appl. No.: 10/054,786

(22) Filed: Jan. 25, 2002

(65) Prior Publication Data

US 2002/0105885 A1 Aug. 8, 2002

(30) Foreign Application Priority Data

Feb. 2, 2001 (JP) ..................................... P2001-026967
Jun. 12, 2001 (JP) ..................................... P2001-177408

(51) Int. Cl.[7] .............................. G11B 7/05; H03M 7/00
(52) U.S. Cl. ..................................... 369/59.23; 341/59
(58) Field of Search ............................. 341/67, 68, 69, 341/58, 59; 369/47.21, 47.15, 47.35, 59.26, 59.27, 59.24, 59.13, 59.23, 124.04, 47.19

(56) References Cited

U.S. PATENT DOCUMENTS

| | | | | |
|---|---|---|---|---|
| 5,790,056 A | * | 8/1998 | Schouhamer Immink | 341/58 |
| 5,870,037 A | * | 2/1999 | Okazaki et al. | 341/58 |
| 5,952,944 A | * | 9/1999 | Nonaka et al. | 341/59 |
| 6,215,750 B1 | * | 4/2001 | Sako et al. | 369/47.24 |
| 6,297,753 B1 | * | 10/2001 | Hayami | 341/59 |
| 6,300,886 B1 | * | 10/2001 | Hayami | 341/59 |
| 6,492,920 B2 | * | 12/2002 | Oki et al. | 369/59.24 |
| 6,545,963 B2 | * | 4/2003 | Deguchi et al. | 369/47.28 |
| 6,690,308 B2 | * | 2/2004 | Hayami | 341/68 |

FOREIGN PATENT DOCUMENTS

JP         2000-068846         3/2000

* cited by examiner

Primary Examiner—Thang V. Tran
(74) Attorney, Agent, or Firm—Nath & Associates PLLC; Gregory B. Kang; Teresa M. Arroyo

(57) ABSTRACT

There is disclosed a synchronous signal generating method, recording apparatus, transmitting apparatus, recording medium and transmission medium in which a plurality of coding tables is used to convert an input data word of p-bits to a code word of q-bits (q>p), and a code word string obtained by directly coupling the code words is recorded and reproduced in a recording medium such as an optical disk and magnetic disk, or transmitted via a transmitting portion. A synchronous frame consists of a synchronous signal and the cord word string satisfying restriction on minimum run length and maximum run length. The synchronous signal is separable from the code word string satisfying a predetermined run length restriction rule, and is constituted with a specific code for identifying its position in one sector, and a synchronous pattern consisting of a first bit pattern having a run length longer than the maximum run length of the predetermined run length restriction rule by 1T or more, and a following second bit pattern having a run length longer than the minimum run length.

10 Claims, 14 Drawing Sheets

| INPUT WORD | TABLE OF STATUS "0" | | "1" | | "2" | | "3" | | "4" | | "5" | |
|---|---|---|---|---|---|---|---|---|---|---|---|---|
| 39 | 0000000001000001 | 0 | 0000010001000100 | 1 | 0000000001000001 | 0 | 0100000000010001 | 0 | 0100100010000001 | 0 | 1000010010100100 | 1 |
| 40 | 0000000001000001 | 1 | 0000010001000000 | 3 | 0000000001000001 | 1 | 0100000000010001 | 1 | 0100100010000001 | 1 | 1000010010100100 | 3 |
| 41 | 0000000001000010 | 1 | 0000010001000000 | 4 | 0000000001000010 | 1 | 0100000000010010 | 1 | 0100100010000001 | 1 | 1000010010100100 | 4 |
| 42 | 0000000001000010 | 2 | 0000010001000000 | 5 | 0000000001000010 | 2 | 0100000000010010 | 2 | 0100100010000010 | 2 | 1000010010100100 | 5 |
| 43 | 0000000001000010 | 3 | 0000010001000001 | 0 | 0000000001000010 | 3 | 0100000000010010 | 3 | 0100100010000010 | 3 | 1000010010100100 | 1 |
| 44 | 0000000001000100 | 1 | 0000010001000001 | 1 | 0000000001000100 | 1 | 0100000000000100 | 1 | 0100100010001000 | 1 | 1000010010001000 | 3 |
| 45 | 0000000001000100 | 2 | 0000010001000010 | 1 | 0000000001000100 | 2 | 0100000000000100 | 2 | 0100100010001000 | 2 | 1000010010001000 | 4 |
| 46 | 0000000001000100 | 3 | 0000010001000010 | 2 | 0000000001000100 | 3 | 0100000000000100 | 3 | 0100100010001000 | 3 | 1000010010001000 | 5 |
| 47 | 0000000001000100 | 4 | 0000010001000010 | 3 | 0000000001000100 | 4 | 0100000000000100 | 4 | 0100100010001000 | 4 | 1000010010001001 | 1 |
| 48 | 0000000001001000 | 1 | 0000010001000010 | 4 | 0000000001000100 | 5 | 0100000000000100 | 5 | 0100100010001000 | 5 | 1000010010001001 | 0 |
| 49 | 0000000001001000 | 2 | 0000010001000100 | 1 | 0000000001001000 | 1 | 0100000000010010 | 1 | 1000000000000001 | 0 | 1000010010001001 | 1 |
| 50 | 0000000001001000 | 3 | 0000010001000100 | 2 | 0000000001001000 | 2 | 0100000000010010 | 2 | 1000000001000001 | 1 | 1000010000000001 | 5 |
| 51 | 0000000001001000 | 4 | 0000010001000100 | 3 | 0000000001001000 | 3 | 0100000000010010 | 3 | 1000000001000010 | 1 | 1000010000000001 | 0 |
| 52 | 0000000001001000 | 5 | 0000010001000100 | 4 | 0000000001001000 | 4 | 0100000000000000 | 4 | 1000000001000010 | 2 | 1000010000000010 | 1 |
| 53 | 0000000001001000 | 1 | 0000010001001000 | 3 | 0000000001001000 | 5 | 0100000000000000 | 5 | 1000000001000100 | 3 | 1000010000000010 | 2 |
| 54 | 0000000001001001 | 3 | 0000010001001000 | 4 | 0000000001001001 | 4 | 0100000000001000 | 4 | 1000000001000100 | 4 | 1000010000000010 | 3 |
| 55 | 0000000001001001 | 5 | 0000010001001000 | 5 | 0000000001001001 | 5 | 0100000000001000 | 5 | 1000000001000100 | 5 | 1000010000000100 | 4 |
| 56 | 0000000001001001 | 1 | 0000010001001001 | 1 | 0000000001001001 | 1 | 0100000000001001 | 1 | 1000000001001000 | 5 | 1000010000000100 | 5 |
| 57 | 0000000001001001 | 2 | 0000010001001001 | 2 | 0000000001001000 | 2 | 0100000000001001 | 2 | 1000000001010010 | 0 | 1000010000000100 | 0 |
| 58 | 0000000001100010 | 3 | 0000010010000010 | 3 | 0000000001100010 | 3 | 0100000010000010 | 3 | 1000000010000001 | 1 | 1000010000001000 | 1 |
| 59 | 0000000001100010 | 4 | 0000010010000010 | 4 | 0000000001100010 | 5 | 0100000010000010 | 5 | 1000000100000010 | 2 | 1000010000001000 | 3 |
| 60 | 0000000001100010 | 5 | 0000010010000010 | 5 | 0000000001100010 | 3 | 0100000010000010 | 3 | 1000000100000010 | 3 | 1000010000001000 | 4 |
| 61 | 0000000001000000 | 3 | 0000010010000000 | 3 | 0000000001000000 | 4 | 0100000010000000 | 4 | 1000000100010000 | 4 | 1000010000010000 | 5 |
| 62 | 0000000001000001 | 5 | 0000010010000001 | 5 | 0000000001000000 | 0 | 0100000010000000 | 5 | 1000000000010000 | 5 | 1000010000010000 | 0 |
| 63 | 0000000001000001 | 1 | 0000010010000001 | 1 | 0000000001000000 | 1 | 0100000010000001 | 1 | 1000000000100000 | 1 | 1000010000100001 | 1 |
| 64 | 0000000001000010 | 2 | 0000010010000010 | 2 | 0000000001000010 | 2 | 0100000010000010 | 2 | 1000000000100010 | 2 | 1000010000100001 | 1 |
| 65 | 0000000001000100 | 3 | 0000010010000100 | 3 | 0000000001000100 | 3 | 0100000010000100 | 3 | 1000000000100100 | 3 | 1000010000010010 | 3 |
| 66 | 0000000001001000 | 4 | 0000010010001000 | 4 | 0000000001001000 | 4 | 0100000010001000 | 4 | 1000000000101000 | 4 | 1000010000100100 | 4 |
| 67 | 0000000001010000 | 5 | 0000010010010000 | 5 | 0000000001010000 | 5 | 0100000010010000 | 5 | 1000000000110000 | 5 | 1000010001000000 | 0 |
| 68 | 0000000001100000 | 3 | 0000010010100000 | 3 | 0000000001000100 | 3 | 0100000001000100 | 3 | 1000000001000000 | 3 | 1000010001000001 | 1 |
| 69 | 0000000010000000 | 4 | 0000010100000000 | 4 | 0000000001001000 | 4 | 0100000001001000 | 4 | 1000000001000000 | 4 | 1000010001000001 | 1 |
| 70 | 0000000010000000 | 5 | 0000011000000000 | 5 | 0000000001010000 | 5 | 0100000001010000 | 5 | 1000000001000000 | 5 | 1000010001000001 | 0 |
| 71 | 0000000010000001 | 3 | 0000100000000001 | 3 | 0000000010000001 | 3 | 0100000001000001 | 3 | 1000000010000000 | 3 | 1000010001001000 | 1 |
| 72 | 0000000010000001 | 4 | 0000100100000000 | 4 | 0000000010000001 | 4 | 0100000001000010 | 4 | 1000000100000000 | 4 | 1000010001010000 | 2 |
| 73 | 0000000010000001 | 5 | 0000100100000000 | 5 | 0000000010000001 | 5 | 0100000001000100 | 5 | 1000000001000000 | 5 | 1000010001000000 | 0 |
| 74 | 0000000010001000 | 3 | 0000100100001000 | 0 | 0000000010001000 | 3 | 0100000001001000 | 3 | 1000000001000001 | 1 | 1000010000000000 | 1 |
| 75 | 0000000010010000 | 4 | 0000100100010000 | 1 | 0000000010010000 | 4 | 0100000001010000 | 4 | 1000000010010000 | 1 | 1000010000000010 | 2 |
| 76 | 0000000010100000 | 5 | 0000100100100000 | 2 | 0000000010100000 | 5 | 0100000001100000 | 5 | 1000000001010000 | 2 | 1000010000100000 | 3 |
| 77 | 0000000010000000 | 3 | 0000100100000000 | 3 | 0000000010000000 | 3 | 0100000010000000 | 3 | 1000000010100000 | 3 | 1000010000100000 | 4 |
| 78 | 0000000100000000 | 4 | 0000100100010000 | 4 | 0000000100000000 | 4 | 0100000100000000 | 4 | 1000000100000000 | 4 | 1000010000100001 | 0 |

FIG. 5

| INPUT WORD | TABLE OF STATUS "0" | | "1" | | "2" | | "3" | | "4" | | "5" | |
|---|---|---|---|---|---|---|---|---|---|---|---|---|
| 79 | 000000100000001 | 0 | 000000010010000 | 5 | 000000100000001 | 0 | 010000010000001 | 0 | 100000000100100 | 3 | 100010000010001 | 1 |
| 80 | 000000100000001 | 1 | 000001001010001 | 0 | 000000100000001 | 1 | 010000010000001 | 1 | 100000000100100 | 4 | 100010000010010 | 2 |
| 81 | 000000100000010 | 1 | 000001001010001 | 1 | 000000100000010 | 1 | 010000010000010 | 1 | 100000000100100 | 5 | 100010000010010 | 2 |
| 82 | 000000100000010 | 2 | 000001001010010 | 1 | 000000100000010 | 2 | 010000010000010 | 2 | 100000001000000 | 1 | 100010000010010 | 3 |
| 83 | 000000100000100 | 1 | 000001001010010 | 2 | 000000100000100 | 1 | 010000010000100 | 1 | 100000001000000 | 3 | 100010000010100 | 1 |
| 84 | 000000100000100 | 3 | 000001001010010 | 3 | 000000100000100 | 3 | 010000010001000 | 3 | 100000001000000 | 4 | 100010000010100 | 3 |
| 85 | 000000100000100 | 3 | 000100000000001 | 3 | 000000100000100 | 3 | 010000010001000 | 3 | 100000001000000 | 5 | 100010000100000 | 4 |
| 86 | 000000100001000 | 1 | 000100000000001 | 0 | 000000100001000 | 1 | 010000010001000 | 1 | 100000001001000 | 1 | 100010000100000 | 5 |
| 87 | 000000100001000 | 3 | 000100000000010 | 1 | 000000100001000 | 3 | 010000010010000 | 3 | 100000001001000 | 3 | 100010001000000 | 3 |
| 88 | 000000100001000 | 4 | 000100000000010 | 2 | 000000100001000 | 4 | 010000010010000 | 4 | 100000001001000 | 4 | 100010001000000 | 4 |
| 89 | 000000100001000 | 5 | 000100000000100 | 3 | 000000100001000 | 5 | 010000010010000 | 5 | 100000001001000 | 5 | 100010001000000 | 5 |
| 90 | 000000100010000 | 1 | 000100000000100 | 0 | 000000100010000 | 1 | 010000100000001 | 0 | 100000100000001 | 0 | 100010001000000 | 0 |
| 91 | 000000100010000 | 3 | 000100000001000 | 1 | 000000100010000 | 3 | 010000100000001 | 1 | 100000100000001 | 1 | 100010001000000 | 1 |
| 92 | 000000100010000 | 4 | 000100000001000 | 2 | 000000100010000 | 4 | 010000100000010 | 1 | 100000100000010 | 2 | 100010001000010 | 2 |
| 93 | 000000100010000 | 5 | 000100000010000 | 1 | 000000100010000 | 5 | 010000100000010 | 2 | 100000100000100 | 1 | 100010001000010 | 3 |
| 94 | 000000100100000 | 1 | 000100000010000 | 2 | 000000100100000 | 1 | 010000100000100 | 1 | 100000100000100 | 3 | 100010001000100 | 1 |
| 95 | 000000100100000 | 3 | 000100000100000 | 3 | 000000100100000 | 3 | 010000100000100 | 3 | 100000100001000 | 4 | 100010001000100 | 3 |
| 96 | 000000100100000 | 4 | 000100001000000 | 4 | 000000100100000 | 4 | 010000100001000 | 4 | 100000100001000 | 5 | 100010001001000 | 4 |
| 97 | 000000100100000 | 5 | 000100001000000 | 5 | 000000100100000 | 5 | 010000100001000 | 5 | 100000100010000 | 1 | 100010001001000 | 5 |
| 98 | 000000101000000 | 1 | 000100010000001 | 1 | 000000101000000 | 1 | 010000100010000 | 1 | 100000100010000 | 3 | 100010010000001 | 1 |
| 99 | 000000101000000 | 4 | 000100010000001 | 3 | 000000101000000 | 4 | 010000100010000 | 3 | 100000100010010 | 4 | 100010010000001 | 3 |
| 100 | 000000101000000 | 5 | 000100010000001 | 4 | 000000101000000 | 5 | 010000100010000 | 4 | 100000100010000 | 5 | 100010010000001 | 4 |
| 101 | 000001000000001 | 0 | 000100010000001 | 5 | 000001000000001 | 0 | 010000100100000 | 5 | 100000100100000 | 3 | 100010010000001 | 5 |
| 102 | 000001000000001 | 1 | 000100010000010 | 1 | 000001000000001 | 1 | 010000100100000 | 1 | 100000100100000 | 4 | 100010010000010 | 1 |
| 103 | 000001000000010 | 1 | 000100010000100 | 1 | 000001000000010 | 1 | 010000100100000 | 4 | 100000100100000 | 5 | 100010010000100 | 1 |
| 104 | 000001000000010 | 2 | 000100010000100 | 3 | 000001000000010 | 2 | 010000100100000 | 5 | 100000101000000 | 0 | 100010010000100 | 3 |
| 105 | 000001000000100 | 1 | 000100010010000 | 1 | 000001000000100 | 1 | 010000101000000 | 1 | 100000101000000 | 1 | 100010010001000 | 1 |
| 106 | 000001000000100 | 3 | 000100010010000 | 3 | 000001000000100 | 3 | 010000101000000 | 3 | 100001000000001 | 0 | 100010010001000 | 3 |
| 107 | 000001000001000 | 1 | 000100010010000 | 5 | 000001000001000 | 1 | 010100100100000 | 5 | 100001000000001 | 1 | 100010010001000 | 5 |
| 108 | 000001000010000 | 1 | 000100100000001 | 0 | 000001000010000 | 1 | 010001000000001 | 0 | 100001000000010 | 1 | 100010010010000 | 1 |
| 109 | 000001000010000 | 3 | 000100100000001 | 1 | 000001000010000 | 3 | 010001000000001 | 1 | 100001000000010 | 2 | 100010010010000 | 3 |
| 110 | 000001000100000 | 1 | 000100100000010 | 1 | 000001000100000 | 1 | 010001000000010 | 1 | 100001000000100 | 1 | 100010100000001 | 1 |
| 111 | 000001001000000 | 1 | 000100100000100 | 1 | 000001001000000 | 1 | 010001000000100 | 1 | 100001000000100 | 3 | 100010100000001 | 5 |
| 112 | 000001001000000 | 3 | 000100100000100 | 3 | 000001001000000 | 3 | 010001000001000 | 1 | 100001000001000 | 1 | 100010100000010 | 1 |
| 113 | 000001001000000 | 5 | 000100100001000 | 1 | 000001001000000 | 5 | 010001000001000 | 3 | 100001000001000 | 3 | 100010100000010 | 3 |
| 114 | 000001010000000 | 1 | 000100100001000 | 3 | 000001010000000 | 1 | 010001000010000 | 1 | 100001000010001 | 4 | 100010100000100 | 4 |
| 115 | 000001010000000 | 3 | 000100100010000 | 1 | 000001010000000 | 3 | 010001000010000 | 3 | 100001000010000 | 1 | 100010100001000 | 3 |
| 116 | 000001010000000 | 4 | 000100100010000 | 3 | 000001010000000 | 4 | 010001000100000 | 4 | 100001000010000 | 3 | 100010100001000 | 4 |
| 117 | 000001010000000 | 5 | 000100101000000 | 4 | 000001010000000 | 5 | 010001001000000 | 5 | 100001000100000 | 4 | 100010100010000 | 5 |
| 118 | 000001100000001 | 1 | 000100101000000 | 5 | 000001100000001 | 1 | 010001001000000 | 1 | 100001000100000 | 5 | 100010100001000 | 1 |

| INPUT WORD | TABLE OF STATUS "0" | | "1" | | "2" | | "3" | | "4" | | "5" | |
|---|---|---|---|---|---|---|---|---|---|---|---|---|
| 159 | 0000000000010000 | 4 | 0000100010010001 | 1 | 0100000000010000 | 4 | 0100010000000010 | 1 | 0100000000010000 | 4 | 1001000001000000 | 4 |
| 160 | 0000000000010000 | 5 | 0000100100010010 | 1 | 0100000000010000 | 5 | 0100010000000010 | 2 | 0100000000010000 | 5 | 1001000001000000 | 5 |
| 161 | 0000000000010001 | 0 | 0000100010010010 | 2 | 0100010000001001 | 0 | 0100010000000010 | 3 | 0100000100000101 | 0 | 1001000001000001 | 0 |
| 162 | 0000000000010001 | 1 | 0000100100010010 | 3 | 0100010000001001 | 1 | 0100010000000100 | 1 | 0100010001001001 | 1 | 1001000001000001 | 1 |
| 163 | 0000000000100010 | 1 | 0000100000000010 | 1 | 0100000000100000 | 1 | 0100010000000100 | 3 | 0100000000100000 | 1 | 1001000001000010 | 1 |
| 164 | 0000000000100010 | 2 | 0000100000010010 | 2 | 0100000000100000 | 3 | 0100010000000100 | 4 | 0100000000100000 | 3 | 1001000001000010 | 2 |
| 165 | 0000000000100010 | 3 | 0000100000010010 | 3 | 0100010000010000 | 4 | 0100010001000000 | 5 | 0100010001000000 | 4 | 1001000001000010 | 3 |
| 166 | 0001000001001000 | 1 | 0000100000010000 | 4 | 0100010000010000 | 5 | 0100010001000000 | 0 | 0100010001000000 | 5 | 1001000001000100 | 1 |
| 167 | 0010000001001000 | 3 | 0000100000010000 | 5 | 0010000100010001 | 0 | 0100000000001000 | 1 | 0100000100010000 | 0 | 1001000001000100 | 3 |
| 168 | 0010000001001000 | 4 | 0000100000000100 | 3 | 0010000100010001 | 1 | 0100000000001000 | 3 | 0100000100010000 | 1 | 1001000001000100 | 4 |
| 169 | 0010000001001000 | 5 | 0000100000000100 | 4 | 0010000100010010 | 0 | 0100010001001000 | 4 | 0100000100010010 | 0 | 1001000001000100 | 5 |
| 170 | 0010000001001001 | 0 | 0000100000000100 | 5 | 0010000100010010 | 1 | 0100010001001000 | 5 | 0100010001000010 | 1 | 1001000001000000 | 3 |
| 171 | 0010000001001001 | 1 | 0000100000000001 | 0 | 0010000100100000 | 0 | 0100001000001001 | 0 | 0100001000010010 | 2 | 1001000001000000 | 4 |
| 172 | 0010000010000001 | 0 | 0000100000100000 | 1 | 0010000100100000 | 2 | 0100001000001001 | 1 | 0100001000010010 | 3 | 1001000001000000 | 5 |
| 173 | 0010000010000001 | 1 | 0000100000100000 | 3 | 0010000100100000 | 3 | 0100001000001000 | 3 | 0100001000010000 | 0 | 1001000010000001 | 0 |
| 174 | 0010000010000010 | 1 | 0000100100001000 | 4 | 0010000100000010 | 1 | 0100001000001000 | 5 | 0100001000010000 | 1 | 1001000010000001 | 1 |
| 175 | 0010000010000010 | 2 | 0000100100001000 | 5 | 0010000100000010 | 2 | 0100010000100001 | 0 | 0100100001000001 | 2 | 1001000010000010 | 1 |
| 176 | 0010000010000010 | 3 | 0000100000001001 | 0 | 0010000100000010 | 3 | 0100010000100001 | 1 | 0100100001000010 | 3 | 1001000010000010 | 2 |
| 177 | 0010000010000100 | 1 | 0000100100001001 | 1 | 0010000100000100 | 1 | 0100010000100010 | 1 | 0100100001000010 | 4 | 1001000010000010 | 3 |
| 178 | 0010000010000100 | 3 | 0000100010000010 | 3 | 0010000100000100 | 3 | 0100010000100010 | 3 | 0100010001000010 | 5 | 1001000010000100 | 1 |
| 179 | 0010000010000100 | 4 | 0000100010000010 | 4 | 0010000100000100 | 4 | 0100000100100010 | 4 | 0100010001000100 | 0 | 1001000010000100 | 3 |
| 180 | 0010000001000100 | 5 | 0000100010000010 | 5 | 0010000100001000 | 5 | 0100000100100100 | 5 | 0100100010000000 | 1 | 1001000010000100 | 4 |
| 181 | 0010000010001000 | 1 | 0000100010000000 | 3 | 0010000100001000 | 0 | 0100000100001000 | 0 | 0100100010000000 | 3 | 1001000010000000 | 5 |
| 182 | 0010000010001000 | 3 | 0000100010000000 | 4 | 0010000100001000 | 3 | 0100100001000000 | 3 | 0100100010000100 | 4 | 1001000010000000 | 1 |
| 183 | 0010000010001000 | 4 | 0000100010000000 | 5 | 0010000100001000 | 4 | 0100100001000000 | 4 | 0100100010000100 | 5 | 1001000010001000 | 3 |
| 184 | 0010000010001001 | 0 | 0000100100000001 | 0 | 0010000100010001 | 5 | 0100100001000000 | 5 | 0100010010000000 | 0 | 1001000010001000 | 4 |
| 185 | 0010000010010001 | 1 | 0000100100000001 | 1 | 0010000100100001 | 0 | 0100100001001001 | 0 | 0100010010000000 | 1 | 1001000010001001 | 0 |
| 186 | 0010000010010001 | 2 | 0000100010000001 | 0 | 0010000100100001 | 1 | 0100100001001001 | 1 | 0100010010010001 | 2 | 1001000010001001 | 1 |
| 187 | 0010000010001001 | 3 | 0000100100000000 | 3 | 0010000100100010 | 2 | 0100100001010000 | 1 | 0100010010010010 | 3 | 1001000010010001 | 2 |
| 188 | 0010000010010010 | 1 | 0000100100000000 | 4 | 0010000100010000 | 0 | 0100100010001001 | 0 | 0100010010010000 | 4 | 1001000010010000 | 0 |
| 189 | 0010000010010010 | 3 | 0000100100000000 | 5 | 0010000100010000 | 1 | 0100100010001001 | 1 | 0100010010010000 | 5 | 1001000010010000 | 1 |
| 190 | 0010000001010000 | 4 | 0000100100010000 | 4 | 0010010001000001 | 2 | 0100100010010000 | 4 | 0100010010001000 | 0 | 1001000010010001 | 3 |
| 191 | 0010000001010000 | 5 | 0000100100010000 | 5 | 0010010001000001 | 3 | 0100100010010000 | 5 | 0100010010001000 | 1 | 1001000010010010 | 5 |
| 192 | 0010000001000001 | 0 | 0000100010000001 | 1 | 0010010001000010 | 1 | 0100100010010001 | 0 | 0100010010001001 | 2 | 1001000010000001 | 0 |
| 193 | 0010000100000001 | 1 | 0000100010000001 | 2 | 0010010001000010 | 2 | 0100100010010001 | 1 | 0100010010010001 | 3 | 1001000010000001 | 1 |
| 194 | 0010000010010000 | 2 | 0000100100000001 | 3 | 0010010001000010 | 3 | 0100100010010010 | 2 | 0100010010010010 | 4 | 1001000010000010 | 2 |
| 195 | 0010000010010000 | 3 | 0000100100000010 | 4 | 0010010001000100 | 4 | 0100100010010010 | 3 | 0100010010010010 | 5 | 1001000010000010 | 3 |
| 196 | 0010000010000000 | 4 | 0000100100000010 | 5 | 0010010001000100 | 5 | 0100100010010010 | 4 | 0100010010000001 | 0 | 1001000010000010 | 4 |
| 197 | 0010000010000000 | 5 | 0000100100000100 | 1 | 0010010010001000 | 1 | 0100100001000100 | 3 | 0100010010000001 | 1 | 1001000010000100 | 0 |
| 198 | 0010000100001000 | 4 | 0000100100001000 | 1 | 0010010010001000 | 2 | 0100100100000000 | 4 | 0100010010001000 | 2 | 1001000010000100 | 3 |

| INPUT WORD | TABLE OF STATUS "0" | | "1" | | "2" | | "3" | | "4" | | "5" | |
|---|---|---|---|---|---|---|---|---|---|---|---|---|
| 239 | 001001000000010 | 2 | 000100100100010 | 1 | 010010000100100 | 4 | 001001000000010 | 2 | 010010000100100 | 4 | 100100100010001 | 1 |
| 240 | 001001000000010 | 3 | 000100100100010 | 2 | 010010000100100 | 5 | 001001000000010 | 3 | 010010000100100 | 5 | 100100100010010 | 1 |
| 241 | 001001000000100 | 1 | 000100100100010 | 3 | 010010001000000 | 1 | 001001000000100 | 1 | 010010001000000 | 1 | 100100100010010 | 2 |
| 242 | 001001000000100 | 3 | 001000000010000 | 1 | 010010001000000 | 3 | 001001000000100 | 3 | 010010001000000 | 3 | 100100100010010 | 3 |
| 243 | 001001000000100 | 4 | 001000000010000 | 3 | 010010001000000 | 4 | 001001000000100 | 4 | 010010001000000 | 4 | 100100100100000 | 1 |
| 244 | 001001000000100 | 5 | 001000000010000 | 4 | 010010001000000 | 5 | 001001000000100 | 5 | 010010001000000 | 5 | 100100100100000 | 3 |
| 245 | 001001000001000 | 1 | 001000000010000 | 5 | 010010001000001 | 0 | 001001000001000 | 1 | 010010001000001 | 0 | 100100100100000 | 4 |
| 246 | 001001000001000 | 3 | 001000000100000 | 1 | 010010001000001 | 1 | 001001000001000 | 3 | 010010001000001 | 1 | 100100100100000 | 5 |
| 247 | 001001000001000 | 4 | 001000000100000 | 3 | 010010001000010 | 1 | 001001000001000 | 4 | 010010001000010 | 1 | 100100100100001 | 0 |
| 248 | 001001000001000 | 5 | 001000000100000 | 4 | 010010001000010 | 2 | 001001000001000 | 5 | 010010001000010 | 2 | 100100100100001 | 1 |
| 249 | 001001000001001 | 0 | 001000000100000 | 5 | 010010001000010 | 3 | 001001000001001 | 0 | 010010001000010 | 3 | 100100100100010 | 1 |
| 250 | 001001000001001 | 1 | 001000001000001 | 0 | 010010001001001 | 0 | 001001000001001 | 1 | 010010001001001 | 0 | 100100100100010 | 2 |
| 251 | 001001000010000 | 1 | 001000001000001 | 1 | 010010001001001 | 1 | 001001000010000 | 1 | 010010001001001 | 1 | 100100100100010 | 3 |
| 252 | 001001000010000 | 3 | 001000001000000 | 3 | 010010010000000 | 3 | 001001000010000 | 3 | 010010010000000 | 3 | 100100100100100 | 1 |
| 253 | 001001000010000 | 4 | 001000001000000 | 4 | 010010010000000 | 4 | 001001000010000 | 4 | 010010010000000 | 4 | 100100100100100 | 3 |
| 254 | 001001000010000 | 5 | 001000001000000 | 5 | 010010010000000 | 5 | 001001000010000 | 5 | 010010010000000 | 5 | 100100100100100 | 4 |
| 255 | 000010000000000 | 5 | 010000001000000 | 5 | 010010000000000 | 5 | #1 | | #2 | | 100100100100100 | 5 |

1 WHEN ZERO RUN LENGTH OF PREVIOUS  
    DATA WORD IS 6 OR LESS   000010000000000  5  
    MORE THAN 7   010010000000000  5

2 WHEN ZERO RUN LENGTH OF PREVIOUS  
    DATA WORD IS OTHER THAN 7 OR 8   010010000000000  5  
    7 OR 8   001000010000000  5

| CASE | ZERO RUN LENGTH ON LSB SIDE | POSSIBLE NEXT STATUS |
|---|---|---|
| 0 | 0 | 0, 1 |
| 1 | 1 | 1, 2, 3 |
| 2 | 2~6 | 1, 3, 4, 5 |
| 3 | 7, 8 | 3, 4, 5 |
| 4 | 9, 10 | 4, 5 |

FIG.12

SYNC SIGNAL TABLE 132

EVEN/ODD RELATION: SYn-1t SIDE | SYn-2t SIDE (ADDITIONALLY, n IS 0 TO 5)

State = 0

|   | 1 bit 13 | 14 bit 30 | 1 bit 13 | 14 bit 30 |
|---|---|---|---|---|
| SY0 | 0000001000100 | 10000000000001000 | 0000000010000 | 10000000000001000 |
| SY1 | 0000000100100 | 10000000000001000 | 0000000100000 | 10000000000001000 |
| SY2 | 0000001001000 | 10000000000001000 | 0000001000000 | 10000000000001000 |
| SY3 | 0000010010000 | 10000000000001000 | 0000010000000 | 10000000000001000 |
| SY4 | 0000010000100 | 10000000000001000 | 0010000100100 | 10000000000001000 |
| SY5 | 0000010001000 | 10000000000001000 | 0010001000100 | 10000000000001000 |

State = 1

|   | 1 bit 13 | 14 bit 30 | 1 bit 13 | 14 bit 30 |
|---|---|---|---|---|
| SY0 | 0000100000100 | 10000000000001000 | 0000100000000 | 10000000000001000 |
| SY1 | 0000100001000 | 10000000000001000 | 0000100100100 | 10000000000001000 |
| SY2 | 0000100010000 | 10000000000001000 | 0001000000000 | 10000000000001000 |
| SY3 | 0000100100000 | 10000000000001000 | 0001000100100 | 10000000000001000 |
| SY4 | 0001000000100 | 10000000000001000 | 0001001000100 | 10000000000001000 |
| SY5 | 0001000001000 | 10000000000001000 | 0001001001000 | 10000000000001000 |

State = 2

|   | 1 bit 13 | 14 bit 30 | 1 bit 13 | 14 bit 30 |
|---|---|---|---|---|
| SY0 | 0000001000100 | 10000000000001000 | 0000000010000 | 10000000000001000 |
| SY1 | 0000000100100 | 10000000000001000 | 0000000100000 | 10000000000001000 |
| SY2 | 0000001001000 | 10000000000001000 | 0000001000000 | 10000000000001000 |
| SY3 | 0000010010000 | 10000000000001000 | 0100010000100 | 10000000000001000 |
| SY4 | 0000010000100 | 10000000000001000 | 0100010001000 | 10000000000001000 |
| SY5 | 0000010001000 | 10000000000001000 | 0100010010000 | 10000000000001000 |

State = 3

|   | 1 bit 13 | 14 bit 30 | 1 bit 13 | 14 bit 30 |
|---|---|---|---|---|
| SY0 | 0100000000100 | 10000000000001000 | 0010010000100 | 10000000000001000 |
| SY1 | 0100000100000 | 10000000000001000 | 0010010001000 | 10000000000001000 |
| SY2 | 0100000010000 | 10000000000001000 | 0010010010000 | 10000000000001000 |
| SY3 | 0100000001000 | 10000000000001000 | 0100000100100 | 10000000000001000 |
| SY4 | 0100001000000 | 10000000000001000 | 0100001000100 | 10000000000001000 |
| SY5 | 0100010000000 | 10000000000001000 | 0100001001000 | 10000000000001000 |

State = 4

|   | 1 bit 13 | 14 bit 30 | 1 bit 13 | 14 bit 30 |
|---|---|---|---|---|
| SY0 | 1000000000100 | 10000000000001000 | 0100100100000 | 10000000000001000 |
| SY1 | 1000000001000 | 10000000000001000 | 1000001000100 | 10000000000001000 |
| SY2 | 1000000010000 | 10000000000001000 | 1000001001000 | 10000000000001000 |
| SY3 | 1000000100000 | 10000000000001000 | 0100010000100 | 10000000000001000 |
| SY4 | 1000001000000 | 10000000000001000 | 0100010001000 | 10000000000001000 |
| SY5 | 1000010000000 | 10000000000001000 | 0100010010000 | 10000000000001000 |

State = 5

|   | 1 bit 13 | 14 bit 30 | 1 bit 13 | 14 bit 30 |
|---|---|---|---|---|
| SY0 | 1000100000000 | 10000000000001000 | 1000010000100 | 10000000000001000 |
| SY1 | 1000100100100 | 10000000000001000 | 1000010001000 | 10000000000001000 |
| SY2 | 1001000000000 | 10000000000001000 | 1000010010000 | 10000000000001000 |
| SY3 | 1001000100100 | 10000000000001000 | 1000100000100 | 10000000000001000 |
| SY4 | 1001001000100 | 10000000000001000 | 1000100001000 | 10000000000001000 |
| SY5 | 1001001001000 | 10000000000001000 | 1000100010000 | 10000000000001000 |

※TOP BIT OF CODE SUBSEQUENT TO SYNCHRONOUS SIGNAL IS SURELY "1"

COLUMN DIRECTION

| 30 | 1365 | 30 | 1365 | 30 | 1365 | 30 | 1365 |
|---|---|---|---|---|---|---|---|
| SY0 | | SY5 | | SY5 | | SY5 | |
| SY1 | | SY1 | | SY1 | | SY1 | |
| SY2 | | SY2 | | SY2 | | SY2 | |
| SY3 | | SY3 | | SY3 | | SY3 | |
| SY1 | | SY2 | | SY2 | | SY1 | |
| SY2 | | SY3 | | SY3 | | SY2 | |
| SY3 | | SY1 | | SY1 | | SY3 | |
| SY1 | | SY4 | | SY4 | | SY1 | |
| SY2 | | SY1 | | SY1 | | SY2 | |
| SY3 | | SY4 | | SY4 | | SY3 | |
| SY1 | | SY3 | | SY3 | | SY1 | |
| SY2 | | SY4 | | SY4 | | SY2 | |
| SY3 | | SY2 | | SY2 | | SY3 | |
| SB | | SB | | SB | | SB | |

13 ROWS

FORMAT FOR 1 SECTOR

– 1 –

SYNCHRONOUS SIGNAL GENERATING METHOD, RECORDING APPARATUS, TRANSMITTING APPARATUS, RECORDING MEDIUM, AND TRANSMISSION MEDIUM

BACKGROUND OF THE INVENTION

1. Field of the Invention

The present invention relates to a synchronous signal generating method, recording apparatus, transmitting apparatus, recording medium, and transmission medium in which a p-bit input data word is converted to a q-bit (q>p) code word using a plurality of coding tables, and a code word string produced by directly coupling the code words is recorded in a recording medium such as an optical disk and magnetic disk and reproduced, or transmitted via a transmitting portion, in which a coding rate is raised according to high density of recording, a synchronous signal for decoding reproduction data is inserted into every predetermined number of code words in a string of the code words, and the synchronous signal is surely separated from the code word string so as to reproduce digital data with high precision.

2. Description of the Related Art

Generally, a pit length to be recorded in an optical disk has a restriction on a minimum run length (minimum pit or land length) due to optical transmission characteristic for recording and reproducing and physical restraint about pit generation and further, a restriction on a maximum run length (maximum pit or land length) for a reason of facilitation of clock generation. Further for protection of a servo band, and the like, it is necessary to modulate signals to be recorded so that the signals have a suppression characteristic of low-pass components of the signals.

As a conventional modulation method satisfying these restrictions, in which the minimum run length (hereinafter referred to also as a minimum reverse interval) is 3T (T=a period of channel bit), and a maximum run length (hereinafter referred to also as a maximum reverse interval) is 11T, an 8 to 14 modulation (EFM) method for use in a compact disk (CD), and EFM+ method for use in a digital versatile disk (DVD) have been well known.

First, in EFM modulation for use in the compact disk (CD), inputted 8-bit (1 byte) digital data is converted to 14-bit run length limited code (hereinafter referred to as a code word) satisfying the run length restriction such that the minimum run length is 3T and the maximum run length is 11T. Furthermore, a 3-bit connection bit for controlling a digital sum value (DSV) and holding a run length restriction rule is attached between the converted code words so that an EFM modulated signal is generated.

In this case, for the minimum run length of 3T, a minimum number of "0" included between logical values "1" and "1" in code words is d=2. On the other hand, for the maximum run length of 11T, a maximum number of "0" included between the logical values "1" and "1" in the code words is k=10. Moreover, the 3-bit connection bit disposed for controlling the DSV and holding the run length restriction rule in order to reduce a DC component and low-pass component of the modulated signal is connected between the 14-bit code words. Thereby, the EFM modulated signal satisfies a run length restriction rule RLL (d, k)=RLL (2, 10) that the minimum run length is 3T and the maximum run length is 11T.

In a CD, the EFM modulated signal with a synchronous signal added is recorded. In a code word string of the EFM modulated signal, a repeating pattern of the maximum run length 11T, that is, a repeating pattern of 11T-11T is avoided so as to set the repeating pattern of 11T-11T as a synchronous signal.

A CD player for reproducing the CD detects the repeating pattern of 11T-11T from signals read from the CD, thereby sampling the synchronous signal.

Next, in the EFM+ method used for the digital versatile disk (DVD), the inputted 8-bit digital data is converted to a 16-bit code word, these code words are directly coupled to one another without using any connection bit, and thereby 8 to 16 modulation is executed so as to satisfy the run length restriction rule RLL (2, 10) that the minimum run length is 3T and the maximum run length is 11T.

The CD player can, as described above, sample the synchronous signal of the repeating pattern of 11T-11T from signals read from the CD. However, reading information on a recording medium such as an optical disk of much higher density than a DVD or a transmission medium for transmitting modulated signals at higher density would be largely affected by interference between codes. If the synchronous signal used for the CD is used in the medium, the synchronous signal of the repeating pattern of 11T-11T may change to a pattern of 11T-10T or 10T-11T to be read. Conversely, it may occur that a data pattern of 10T-11T or 11T-10T of the EFM modulated signal changes to the repeating pattern of 11T-11T and is erroneously detected as the synchronous signal.

This increases error generation frequency in detecting the synchronous signal in high density recording on a recording medium such as an optical disk or in high density data transmission, leading to easy generation of a burst error due to the loss of synchronization.

Although the DVD using the EFM+ method solves the above problem because the synchronous signal is set at 14T-4T, it causes a lower coding rate.

SUMMARY OF THE INVENTION

An object of the present invention is to provide a synchronous signal generating method, recording apparatus, transmitting apparatus, recording medium, and transmission medium in which a p-bit input data word is converted to a q-bit (q>p) code word, and a code word string produced by directly coupling the code words is recorded in recording mediums such as an optical disk and magnetic disk and reproduced, or transmitted via a transmitting portion, in which a coding rate is raised according to high density of recording, a synchronous signal for decoding reproduction data is inserted into every predetermined number of code words in a string of the code words, and at the same time, the synchronous signal is surely separated from the code word string so as to reproduce digital data with high precision.

To achieve the object, there is provided a synchronous signal generating method in which a plurality of coding tables is used to subject an input data word of p-bits to modulation and to thereby obtain a code word of q-bits (q>p), the plurality of coding tables storing the code words corresponding to the respective input data words, and state information indicating the coding table for use in modulating a next input data word to obtain a next code word satisfying a predetermined run length restriction rule even with the next code word coupled directly with the code word, and a synchronous signal for decoding reproducing data is inserted into every predetermined number of code words in a string of the code words satisfying the predetermined run length restriction rule, so as to generate a synchronous frame, wherein the synchronous signal is separable from the string of code words satisfying the predetermined run length restriction rule, and comprises a specific code for identifying the position in one sector and a synchronous pattern comprising a first bit pattern of a run length longer than a maximum run length in the predetermined run length restriction rule by 1T or more (T is a period of channel bit of the cord words) and a following second bit pattern of a run length longer than a minimum run length, and the synchronous pattern includes part of a following code word.

In a preferred embodiment of the present invention, a specific coding table and another specific coding table of the plurality of coding tables are allotted to have an even/odd relation such that the number of "1" in each of the code words stored corresponding to the respective predetermined input data words is even in the specific coding table and the number of "1" in the code word is odd in the other specific coding table so as to enable a DSV control, and when the predetermined input data word is modulated, the code word having a smaller absolute value is selected from an absolute value of a DSV value obtained from the code word using the specific coding table, and an absolute value of a DSV value obtained from the code word modulated using the other specific coding table, and the DSV control is performed, and a synchronous signal for decoding reproducing data is inserted into every predetermined number of code words in a string of the code words satisfying the predetermined run length restriction rule, so as to generate the synchronous frame.

In a preferred embodiment of the present invention, a plurality of synchronous signal tables is prepared corresponding to the plurality of coding tables, and a plurality of synchronous signal bit patterns for generating the synchronous signal is set in each of the synchronous signal tables, each of the synchronous signal bit pattern having two bit patterns in even/odd relation such that the number of "1" is even in one pattern and is odd in the other pattern to allow selection therebetween by a DSV control.

In a preferred embodiment of the present invention, the p bit is 8 bit, the q bit is 15 bit, and the run length restriction rule sets a minimum run length of a signal of the code words subjected to NRZI conversion at 3T without the synchronous signal and a maximum run length at one of 1T, 12T, 13T and 14T.

Further, in order to achieve the above object, there is provided a recording apparatus in which a plurality of coding tables is used to subject an input data word of p-bits to modulation and to thereby obtain a code word of q-bits (q>p), the plurality of coding tables storing the code words corresponding to the respective input data words, and state information indicating the coding table for use in modulating a next input data word to obtain a next code word satisfying a predetermined run length restriction rule even with the next code word coupled directly with the code word, and a synchronous signal for decoding reproducing data is inserted into every predetermined number of code words in a string of the code words satisfying the predetermined run length restriction rule, so as to generate a synchronous frame and sequentially record synchronous frames in a recording medium, wherein the synchronous signal is separable from the string of code words satisfying the predetermined run length restriction rule, and comprises a specific code for identifying the position in one sector and a synchronous pattern comprising a first bit pattern of a run length longer than a maximum run length in the predetermined run length restriction rule by 1T or more (T is a period of channel bit of the cord words) and a following second bit pattern of a run length longer than a minimum run length, and the synchronous pattern includes part of a following code word.

In a preferred embodiment of the present invention, a specific coding table and another specific coding table of the plurality of coding tables are allotted to have an even/odd relation such that the number of "1" in each of the code words stored corresponding to the respective predetermined input data words is even in the specific coding table and the number of "1" in the code word is odd in the other specific coding table so as to enable a DSV control, and when the predetermined input data word is modulated, the code word having a smaller absolute value is selected from an absolute value of a DSV value obtained from the code word using the specific coding table, and an absolute value of a DSV value obtained from the code word modulated using the other specific coding table, and the DSV control is performed, and a synchronous signal for decoding reproducing data is inserted into every predetermined number of code words in a string of the code words satisfying the predetermined run length restriction rule, so as to generate the synchronous frame.

Further, in order to achieve the above object, there is provided a transmitting apparatus in which a plurality of coding tables is used to subject an input data word of p-bits to modulation and to thereby obtain a code word of q-bits (q>p), the plurality of coding tables storing the code words corresponding to the respective input data words, and state information indicating the coding table for use in modulating a next input data word to obtain a next code word satisfying a predetermined run length restriction rule even with the next code word coupled directly with the code word, and a synchronous signal for decoding reproducing data is inserted into every predetermined number of code words in a string of the code words satisfying the predetermined run length restriction rule, so as to generate a synchronous frame and sequentially transmit synchronous frames by wire or radio, wherein the synchronous signal is separable from the string of code words satisfying the predetermined run length restriction rule, and comprises a specific code for identifying the position in one sector and a synchronous pattern comprising a first bit pattern of a run length longer than a maximum run length in the predetermined run length restriction rule by 1T or more (T is a period of channel bit of the cord words) and a following second bit pattern of a run length longer than a minimum run length, and the synchronous pattern includes part of a following code word.

In a preferred embodiment of the present invention, a specific coding table and another specific coding table of the plurality of coding tables are allotted to have an even/odd relation such that the number of "1" in each of the code words stored corresponding to the respective predetermined input data words is even in the specific coding table and the number of "1" in the code word is odd in the other specific coding table so as to enable a DSV control, and when the predetermined input data word is modulated, the code word having a smaller absolute value is selected from an absolute value of a DSV value obtained from the code word using the specific coding table, and an absolute value of a DSV value obtained from the code word modulated using the other specific coding table, and the DSV control is performed, and a synchronous signal for decoding reproducing data is inserted into every predetermined number of code words in a string of the code words satisfying the predetermined run length restriction rule, so as to generate the synchronous frame.

Further, in order to achieve the above object, there is provided a recording medium which is recorded using the synchronous signal generating method described as the first invention.

Further, in order to achieve the above object, there is provided a transmission medium which is transmitted using the synchronous signal generating method described as the first invention.

The nature, principle and utility of the invention will become more apparent from the following detailed description when read in conjunction with the accompanying drawings.

BRIEF DESCRIPTION OF THE DRAWINGS

In the accompanying drawings:

FIG. 3 is a diagram (Diagram 1) showing one example of a coding table;

FIG. 4 is a diagram (Diagram 2) showing one example of the coding table;

FIG. 5 is a diagram (Diagram 3) showing one example of the coding table;

FIG. 6 is a diagram (Diagram 4) showing one example of the coding table;

FIG. 7 is a diagram (Diagram 5) showing one example of the coding table;

FIG. 8 is a diagram (Diagram 6) showing one example of the coding table;

FIG. 9 is a diagram (Diagram 7) showing one example of the coding table;

FIG. 12 is a diagram showing one example of a synchronous signal table;

DESCRIPTION OF THE PREFERRED EMBODIMENTS

One embodiment of a synchronous signal generating method, recording apparatus, transmitting apparatus, recording medium, and transmission medium according to the present invention will be described in detail with reference to FIGS. 1 to 16.

<Synchronous Signal Generating Method, Recording Apparatus, Recording Medium>

Figure 1:
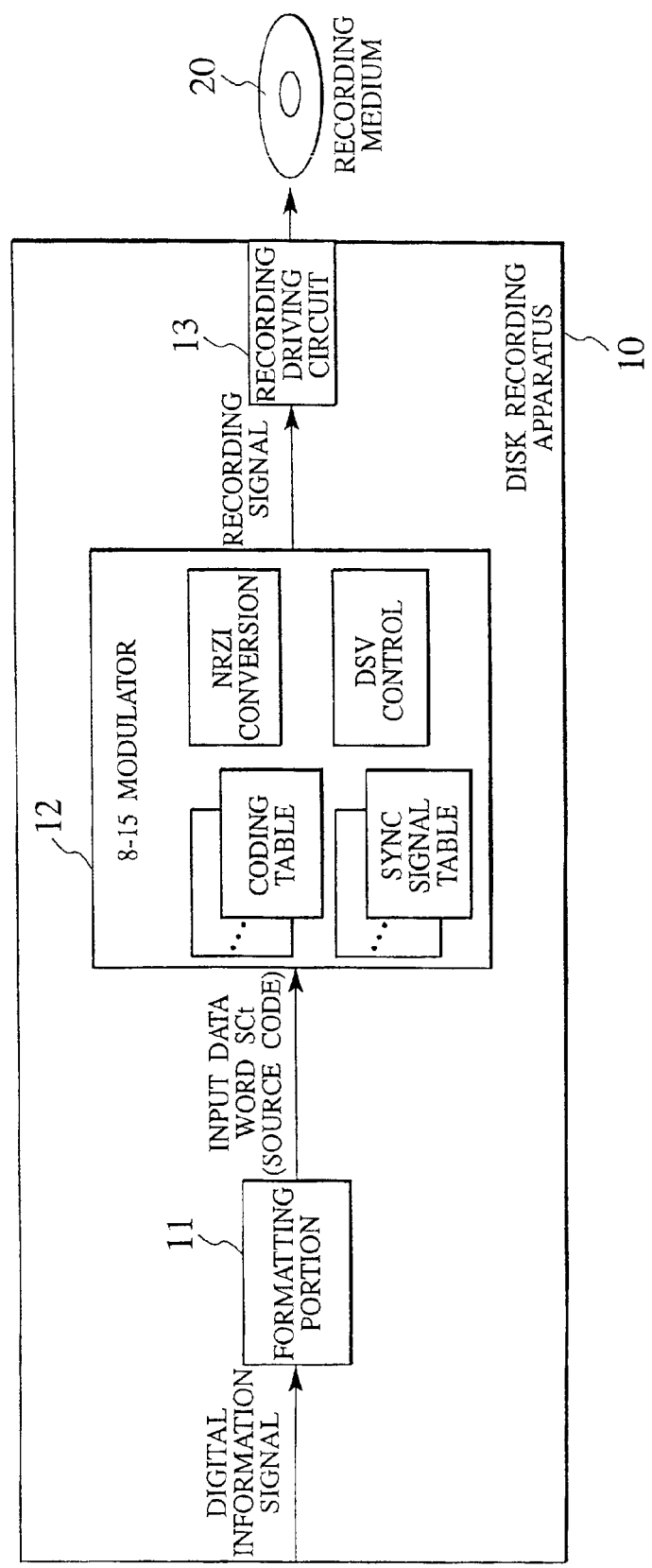
FIG. 1 is a block diagram showing a disk recording apparatus in an embodiment of a synchronous signal generating method and a recording apparatus according to the present invention.

FIG. 1 is a block diagram showing a disk recording apparatus to which one embodiment of the synchronous signal generating method and the recording apparatus according to the present invention are applied.

As shown in FIG. 1, a disk recording apparatus 10 to which one embodiment of the synchronous signal generating method and the recording apparatus according to the present invention are applied is roughly constituted of a formatting portion 11, 8–15 modulator 12, and recording driving circuit 13. In the apparatus, a digital signal relating to information such as image and sound inputted to the disk recording apparatus 10 is subjected to 8–15 modulation by the 8–15 modulator 12 via the formatting portion 11, and the 8–15 modulated signal is recorded in an optical disk or a magnetic disk by the recording driving circuit 13, so that a recording medium 20 according to the present invention is obtained.

First, the digital signal relating to the information such as the image and sound has a continuation of input data words SCt having a bit number p=8 bits. An input data word SCt is inputted together with a control signal to be recorded together into the formatting portion 11, where an error correction code or the like is added and then the format of the data is converted to a control format in accordance with a recording format of the recording medium 20. Then the 8-bit input data words SCt is outputted as a source cord from the formatting portion 11 to the 8–15 modulator 12.

Subsequently, in the 8–15 modulator 12, a plurality of coding tables described later are referred to, and the input data word SCt having the bit number p=8 is converted (8–15 modulated) to a code word having a bit number q=15. Additionally, a plurality of synchronous signal tables described later are referred to, thereby a synchronous signal is inserted into every predetermined number of code words (e.g., 91 code words). Additionally, a code word string constituted of the synchronous signal and a plurality of code words is subjected to NRZI conversion, subsequently subjected to a digital sum value (DSV) control, and outputted as a recording signal to the recording driving circuit 13. Thereafter, as not shown, the recording signal supplied to the recording driving circuit 13 is subjected to optical modulation by an optical modulator, the recording medium 20 such as the optical disk and magnetic disk is subsequently irradiated with light via an optical system having an objective lens, and the signal is recorded. In this case, the recording signal obtained as described above is a signal having a coding rate raised with densification to the recording medium 20.

Here, the 8–15 modulator 12 as a main part of the present invention will be described with reference to FIGS. 2 to 15.

Figure 2:
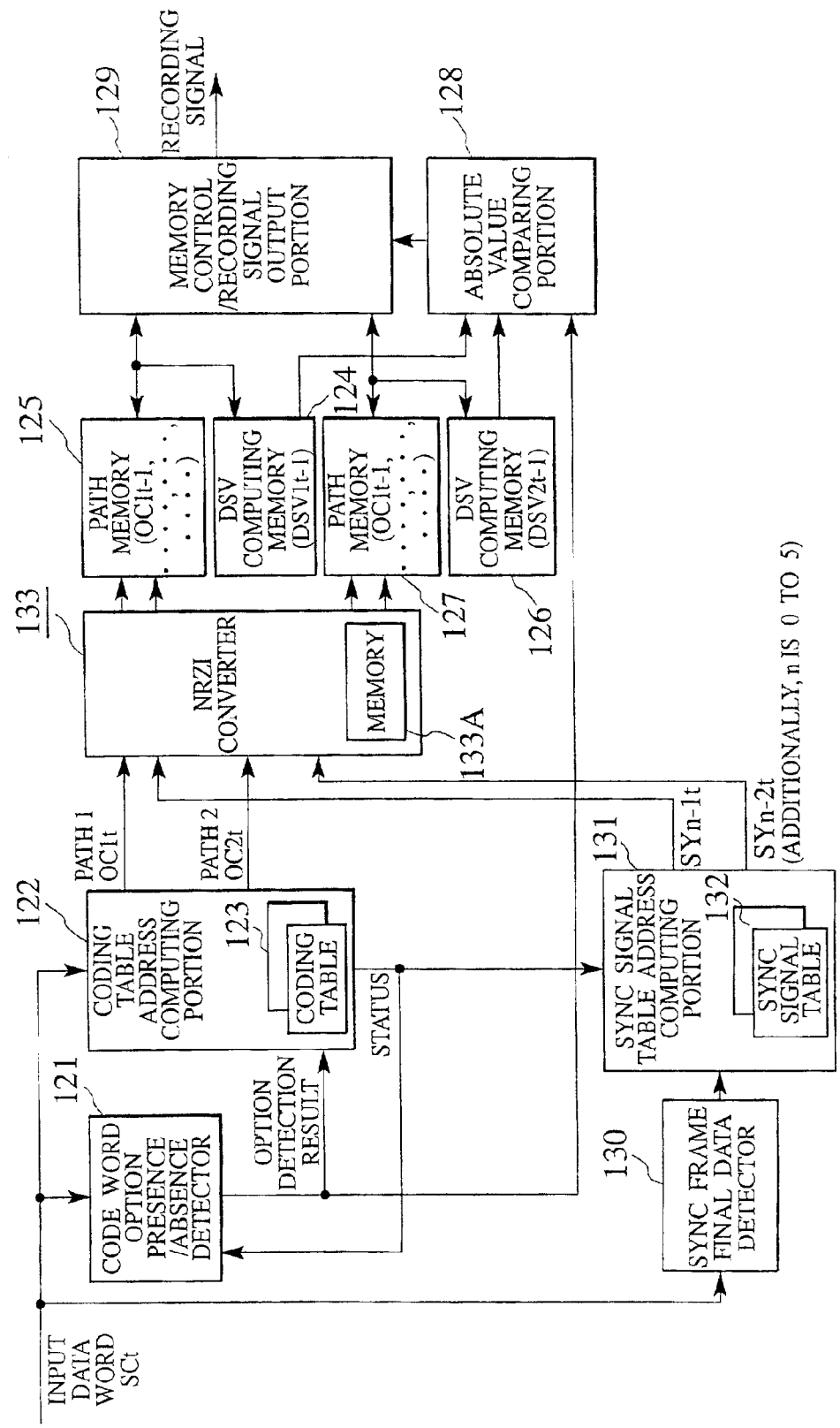
FIG. 2 is a block diagram showing an 8–15 modulator shown in FIG. 1.

FIG. 2 is a block diagram showing the 8–15 modulator shown in FIG. 1.

As shown in FIG. 2, the 8–15 modulator 12 as the main part of the present invention is constituted of a code word option presence/absence detector 121, a coding table address computing portion 122 including a plurality of coding tables 123, a synchronous frame final data detector 130, a synchronous signal table address computing portion 131 including a plurality of synchronous signal tables 132, an NRZI converter 133, first and second path memories 125, 127, first and second DSV computing memories 124, 126, an absolute value comparing portion 128, and a memory control/recording signal output portion 129.

Prior to description of an operation of each constituting member in the 8–15 modulator 12, the plurality of coding tables 123 disposed in the coding table address computing portion 122, and the plurality of synchronous signal tables 132 disposed in the synchronous signal table address computing portion 131 will first be described.

(Coding Table)

Figures 10, 11:
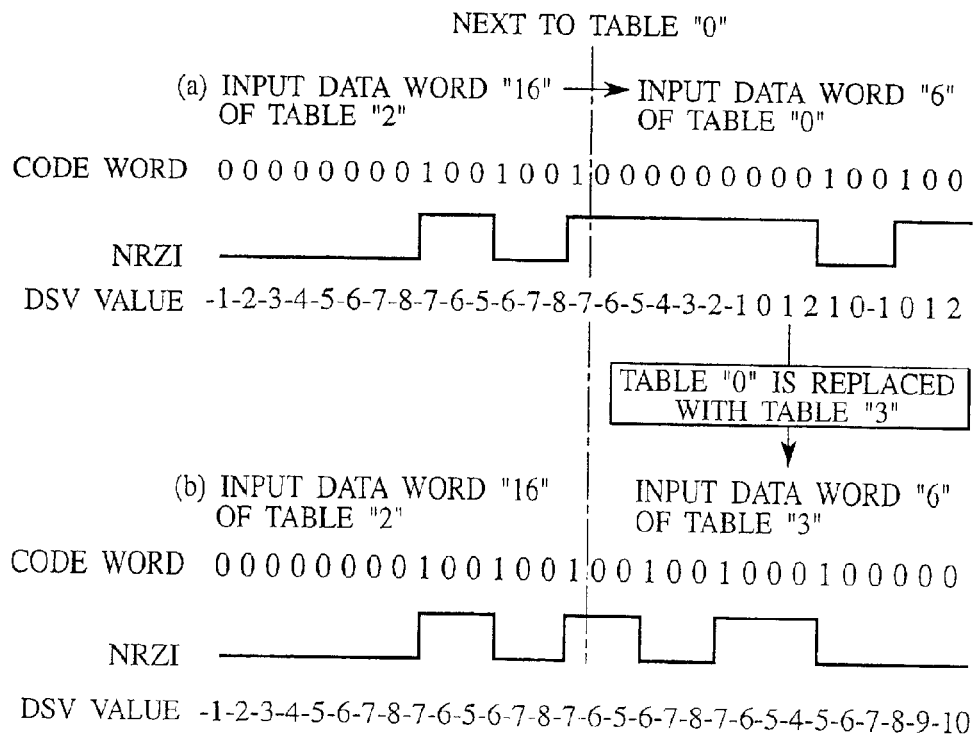
FIG. 10 is a diagram showing a next possible coding table in five classified cases with respect to a plurality of coding tables shown in FIGS. 3 to 9.
FIG. 11 is an explanatory view of replacement between the specific coding table and the other specific coding table among the plurality of coding tables with respect to the input data words.
Figure 6:
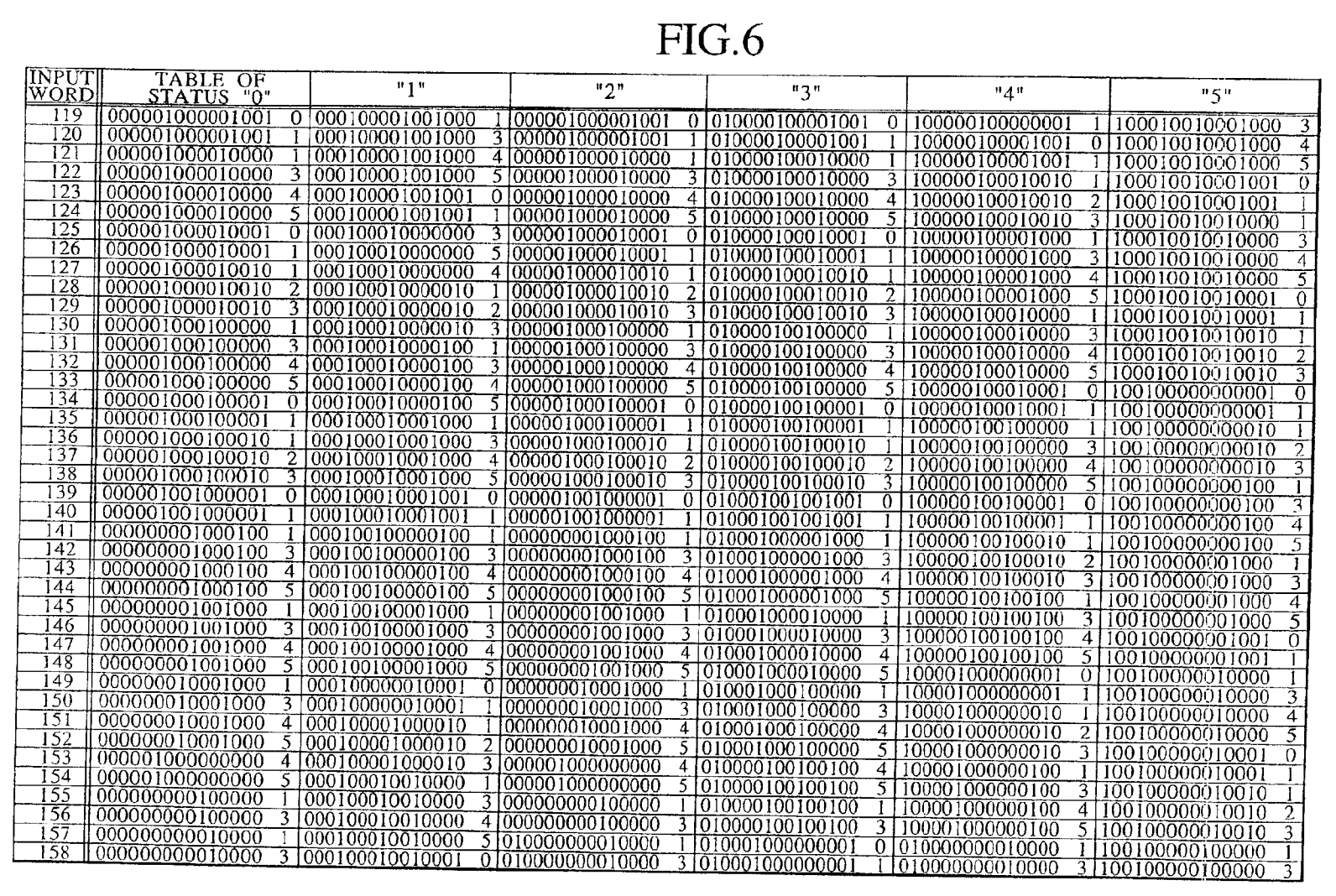
Figure 8:
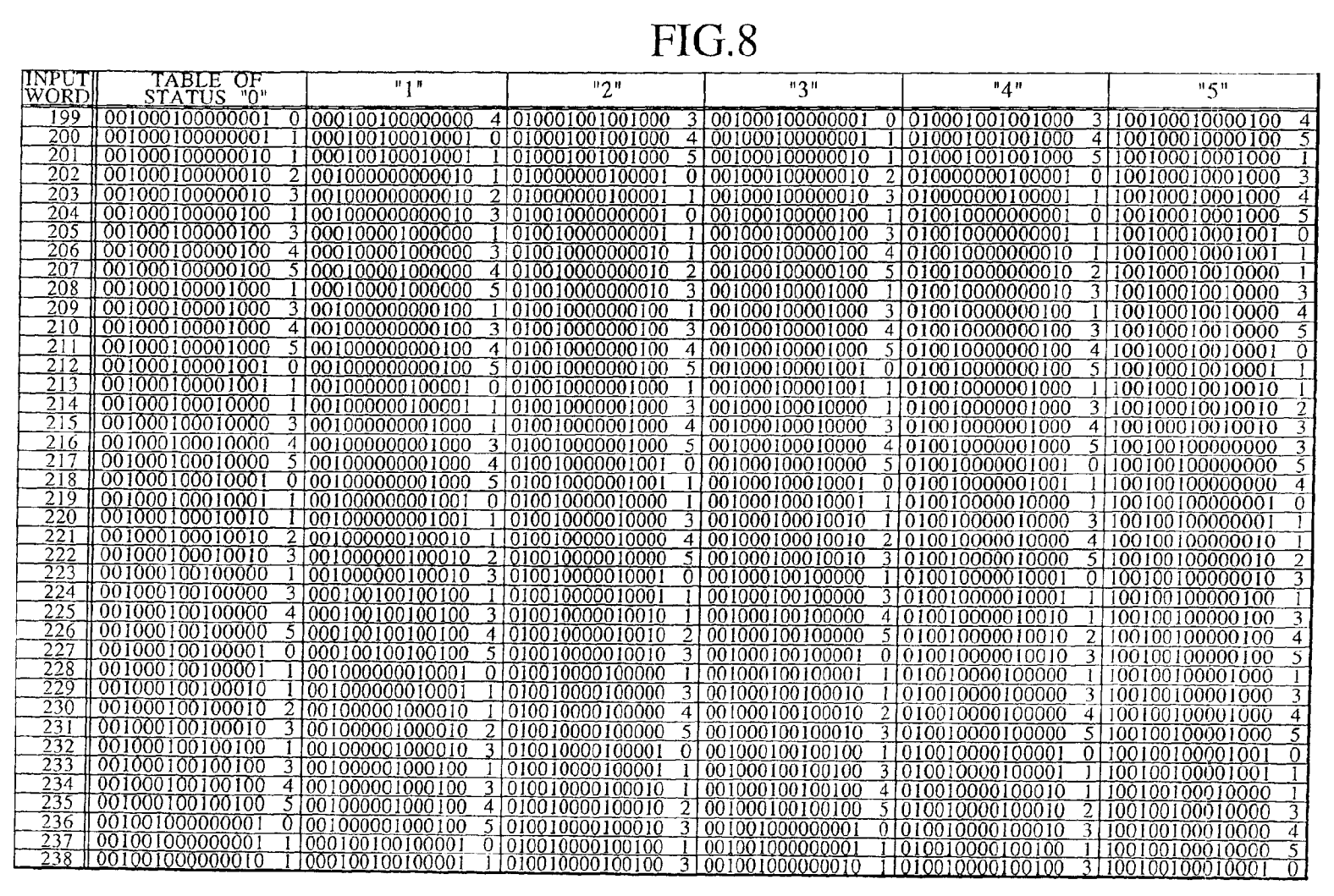

FIGS. 3 to 9 are diagrams showing one example of the coding table in order of Diagrams 1 to 7. FIG. 10 is a diagram showing a next possible coding table in five classified cases with respect to a plurality of coding tables shown in FIGS. 3 to 9. FIG. 11 is an explanatory view of replacement between the specific coding table and the other specific coding table among the plurality of coding tables with respect to the input data words.

As shown in FIGS. 3 to 9, for the plurality of coding tables 123 disposed in the coding table computing portion 122, an initial table for setting the initial values of choices of the coding tables with respect to the input data word to be first inputted, and six coding tables constituted of states "0" to "5" are prepared beforehand.

Figure 3:
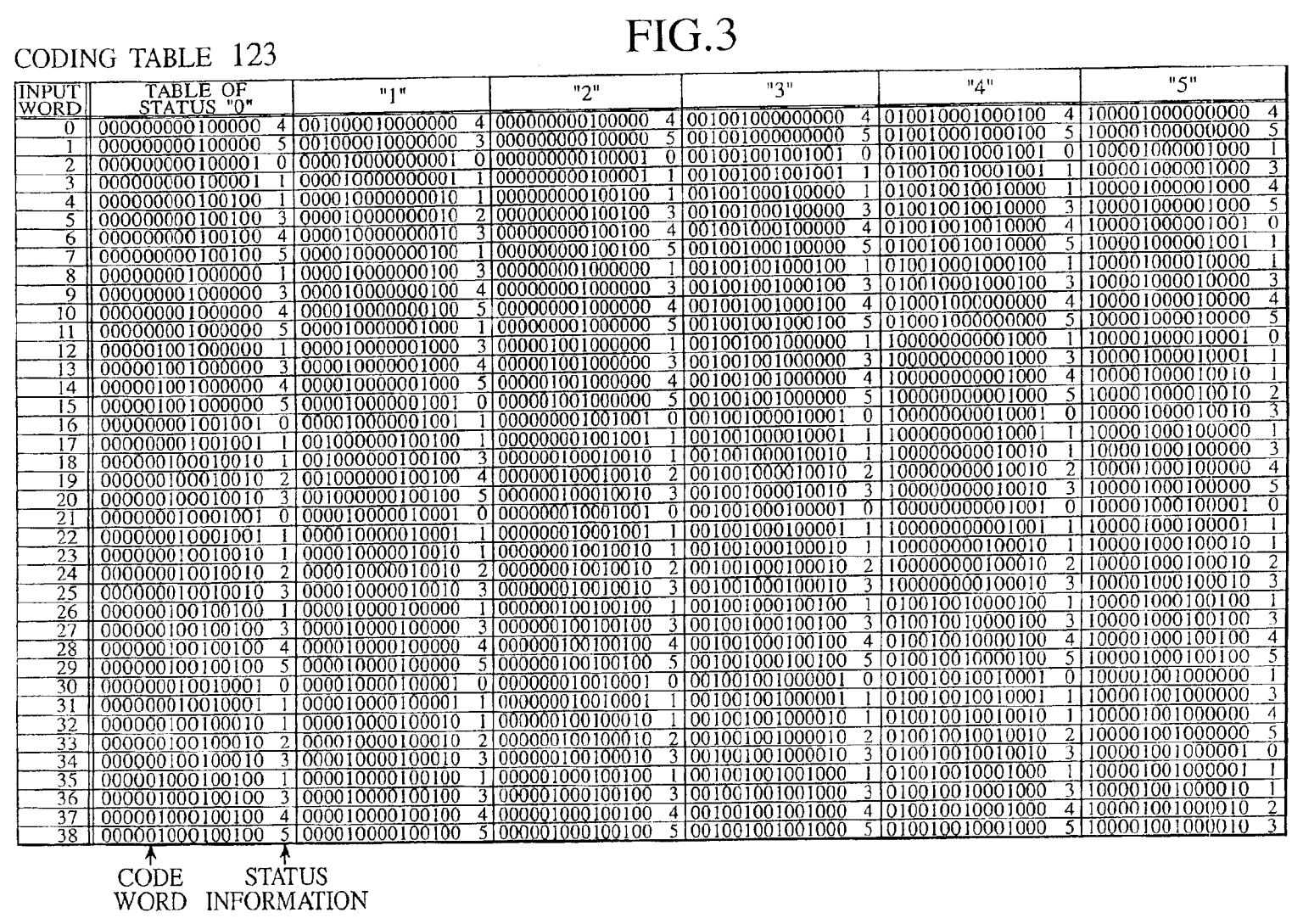

Moreover, for the six coding tables, the 8-bit input data word SCt is allotted to "0" to "255" in terms of decimal number, and the respective input data words SCt allotted to "0" to "255" are converted to respective 15-bit code words shown in terms of binary number. Additionally, a right-end number of each code word sets state information (next state) indicating the coding table for use in modulating the input data word SCt in order to obtain a next code word satisfying a predetermined run length restriction rule, even when the code words are directly coupled to each other and thus the code word string is generated. This will be described more concretely. For example, the coding table of state "0" shown in FIG. 3 is referred to, and it is then seen that the state information is "4" with input data word "0", the state information is "5" with input data word "1", and the state information is "0" with input data word "2". Therefore, when the coding table of state "0" is used and the input data word "0" is modulated (coded), the coding table of state "4" is used to modulate the next input data word SCt.

Moreover, the six coding tables are set such that each inputted data word SCt is converted to a 15-bit code word (one code word) so as to satisfy the run length restriction rule RLL (2, 10) having a minimum run length of 3T and maximum run length of 11T. In this case, as described in the conventional art, with the minimum run length of 3T, d=2 "0"s at minimum are included between logic values "1" and "1" in the 15-bit code word, and with the maximum run length of 11T, k=10 "0"s at maximum are included between the logic values "1" and "1" in the 15-bit code word, so that the run length restriction rule RLL (d, k) =RLL (2, 10) is satisfied. Additionally, the tables are set so as to satisfy the run length restriction rule RLL (2, 10) even with the code word string constituted by directly coupling the code words to each other.

Furthermore, in the six coding tables, as shown in FIG. 10, a possible state of the coding table transiting to the next can be classified into five cases of cases 0 to 4 by a zero run length on an LSB side (lower bit side) in the outputted 15-bit code word.

Additionally, for the six coding tables, the code words stored corresponding to the predetermined input data words SCt are allotted to have an even/odd relation such that the number of "1" in 15 bits is even (odd) in the code word in the specific coding table and the number is odd (even) in the code word in the other coding table so as to perform the DSV control. Moreover, the code words are allotted such that during the DSV control of each signal obtained by NRZI conversion of each code word, polarities of DSV values are +− reverse polarities.

Furthermore, as described later, as a mode for switching the code word between the code word of the specific coding table corresponding to the predetermined input data word SCt and the code word of the other coding table corresponding to the same predetermined input data word SCt so that the code word having a smaller absolute value of DSV value (equivalent to a direction in which the DSV value approaches 0) can be taken, the three first to third modes are set as described later. Therefore, for the first to third modes described later, it is judged that "there is an option" with respect to the predetermined input data word SCt. In other cases, it is judged that "there is not any option" with respect to the predetermined input data word SCt.

That is, in the first mode, when the specific coding table is the coding table of state "0" and the other specific coding table is the coding table of state "3", the respective signals obtained by NRZI conversion of the respective output code words of the coding tables of states "0" and "3" corresponding to the input data words "0" to "38" have polarities opposite to each other in terms of the DSV value (even/odd parities of the number of "1"s included in the code words are different from each other). However, as shown in a DSV control flowchart at a time of 8–15 modulation of FIG. 15 described later, in consideration of a decoding time, when the state information "0" is detected, the respective output code words of the coding table of state "0" corresponding to the input data words "0" to "38" can be replaced with the respective output code words of the coding table of state "3" corresponding to the input data words "0" to "38". Additionally, even when the code words are replaced, the run length restriction rule can be maintained, and further the decoding is possible.

This respect will more concretely be described with reference to section (a) and (b) in FIG. 11. As shown in (a) of FIG. 11, for example, when the coding table of state "2" is used to convert the input data word "16" to code word {000000001001001}, the coding table of state "0" is designated in accordance with the state information. Thereby, the state information "0" is detected, the coding table of state "0" is used to convert the next inputted data word "6" to code word {000000000100100}, then the number of "1" in the code word {000000000100100} is two and even.

On the other hand, as shown in (b) of FIG. 11, when the coding table of state "2" is used to convert the input data word "16" to code word {000000001001001}, the next coding table of state "0" is designated in accordance with the state information. However, as described above, the table is set so as to be replaceable with the coding table of state "3". Thereby, when the coding table of state "3" is used to convert the input data word "6" to code word {001001000100000}, the number of "1" in the code word {001001000100000} is three and odd. Therefore, the coding table of state "0" and the coding table of state "3" have an even/odd relation of the number of "1" with respect to the input data word "6".

Thereafter, the code word strings in (a), (b) of FIG. 11 is subjected to the NRZI conversion. Here, because the NRZI conversion carries out modulation by inverting the polarity at bit "1" while not converting the polarity at bit "0" as well known, the respective signals are obtained as shown in (a), (b) of FIG. 11.

Thereafter, the DSV values are compared with each other in order to perform a satisfactory DSV control with respect to the respective signals obtained by the NRZI conversion of the code word strings of (a), (b) in FIG. 11, and a smaller absolute value of the DSV value is selected. This DSV value is an accumulated value from a start point of each signal obtained by the NRZI conversion with the value of bit "1" as +1 and the value of bit "0" as −1, as well known. In case of (a) in FIG. 11, the DSV value is +2 while in case of (b) in FIG. 11, the DSV value is −10, so that the polarities of the DSV values of the two cases are opposite. Also, even if the coding tables are replaced, the run length restriction rule can be maintained and further, decoding is possible. Meanwhile, as for the examples of (a), (b) in FIG. 11, because the case of (a) in FIG. 11 provides a smaller absolute value in terms of the DSV value, this case should be selected. Usually, the DSV value changes depending on the status since before.

Next, in the second mode, when the specific coding table is the coding table of state "2" and the other specific coding table is the coding table of state "4", the even/odd relation is disposed for the number of "1" with respect to the input data words "0" to "11" and "26" to "47" of the respective coding tables of states "2" and "4". Also as shown in the DSV control flowchart at the time of 8–15 modulation of FIG. 15, in consideration of the decoding time, when the state information "2" is detected, the respective output code words of the coding table of state "2" corresponding to the input data words "0" to "11" and "26" to "47" can be replaced with the respective output code words of the coding table of state "4" corresponding to the input data words "0" to "11" and "26" to "47". Additionally, even when the code words are replaced, the run length restriction rule can be maintained, and further the decoding is possible.

Subsequently, in the third mode, regarding the coding table of status "3", when the zero run length on the LSB side of a previous output code word is 2 to 6 and the input data word SCt is less than "156", it is also applicable as far as the run length restriction rule is satisfied even if a next code word is replaced with an output code word in the coding table of status "0".

In the plurality of coding tables 123 described above, when the input data word SCt having a bit number p=8 is converted to the code word having a bit number q=15 bits in accordance with respective promises of the aforementioned coding time, the 8–15 modulation is performed to satisfy the run length restriction rule RLL (d, k)=RLL (2, 10) having a minimum run length of 3T and maximum run length of 11T. This is not limited. The six coding tables can be used to change the run length restriction rule to RLL (2, 11), RLL (2, 12), or RLL (2, 13). In this case, when the run length restriction rule is changed in step 407 of an operation flow (FIG. 15) described later, the minimum run length of 3T and maximum run length of 12T, 13T, or 14T are partially possible excluding conditions of steps 403, 405.

Of course, when the input data word SCt of p=8 is converted to the code word of q=15 bits in the same technical idea as that of the coding table without using the six coding tables, it is also possible to newly set the respective code words and state information in the coding table in order to satisfy the minimum run length of 3T and maximum run length of 12T, 13T, or 14T. When the maximum run length is set to 12T, 13T, or 14T longer than 11T, it is possible to further increase opportunities for the DSV control with an increase of the maximum run length. Additionally, the arrangement of the code words with respect to the data word is not limited to that of the present example, and the arrangement can also be changed without disturbing the run length principle.

(Synchronous Signal Table)

Figures 13, 14:
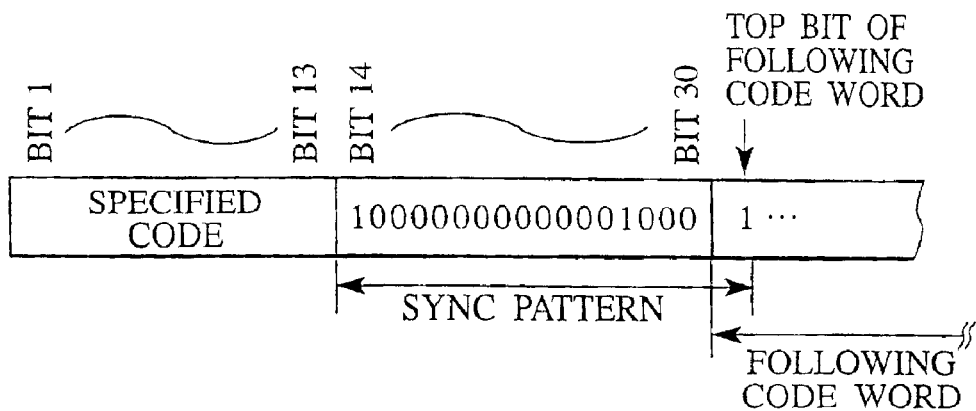
FIG. 13 is a diagram showing a format of the coding table of a synchronous signal.
FIG. 14 is a diagram showing a format of a transmission signal for one sector.

FIG. 12 is a diagram showing one example of the synchronous signal table. FIG. 13 is a diagram showing a format of the coding table of the synchronous signal. FIG. 14 is a diagram showing a format of a transmission signal for one sector.

As shown in FIG. 12, for the plurality of synchronous signal tables 132 disposed in the synchronous signal table address computing portion 131, an initial table for setting an initial value of the option of the synchronous signal table with respect to the synchronous signal to be first inputted, and six synchronous signal tables constituted of states "0" to "5" corresponding to the state information of the coding table 123 described above are prepared beforehand.

Moreover, the respective synchronous signal tables of the states "0" to "5" are prepared in accordance with the state information in order to obtain the next code word SCt of final input data of a synchronous frame. Additionally, the signals are grouped into five synchronous signal bit patterns constituted of SY0 to SY5 in each synchronous signal table.

Furthermore, for the five synchronous signal bit patterns SY0 to SY5, two synchronous signal bit patterns constituted of a synchronous signal bit pattern SYn-1t (n is in a range of 0 to 5) of 1 to 30 bits on a left side of the drawing and a synchronous signal bit pattern SYn-2t (n is in a range of 0 to 5) of 1 to 30 bits on a right side of the drawing are regarded as one set. For the DSV control, the even/odd relation is disposed such that the number of "1" is even (or odd) in one synchronous signal bit pattern SYn-1t and is odd (or even) in the other synchronous signal bit pattern SYn-2t. The bit patterns are allotted so that the polarities of the DSV values of the respective DSV controlled signals obtained by the NRZI conversion of the respective synchronous signal bit patterns SYn-1t, SYn-2t are +− reverse polarities.

Furthermore, as shown in FIG. 13 in an enlarged manner, the synchronous signal bit pattern constituted of 1 to 30 bits is constituted of a specific code of 1 to 13 bits, and a most part of bit strings of a synchronous pattern of 14 to 30 bits following the specific code. Additionally, the synchronous pattern is constituted of 14 to 30 bits in the synchronous signal bit pattern, and a part of the following code word. Moreover, the modulation is performed such that the top bit of the code word SCt following the synchronous signal is set to "1" by setting an uppermost bit as a top bit of the following code word to "1". In this case, for the coding table 123 in which the top bit of the code word is "1", the coding table of state "5" is prepared in the embodiment.

Furthermore, the specific code in the synchronous signal bit pattern is allotted to bits 1 to 13. Therefore, positions in one sector described later can be identified, and DC control is enabled.

Moreover, in the aforementioned synchronous pattern, a first bit pattern having a maximum run length of 13T longer than 11T by 2T in an 8–15 modulation signal is used as a core. The synchronous pattern has a 13T-4T arrangement in which a second bit pattern having a fixed length of 4T is disposed after the first bit pattern of 13T, that is, a bit pattern of {100000000000010001}, and a fixed pattern common to all the synchronous signals. In this case, the second bit pattern of 4T arranged after the first bit pattern of 13T in the synchronous pattern has a fixed length. This is because disposing the specific code in the upper portion of synchronous pattern enables a degree of freedom to increase and also enables the possible number of patterns of the specific code to be sufficiently secured.

Additionally, in the synchronous signal table 132 of the aforementioned embodiment, a maximum interval of the synchronous pattern constituted of bits 14 to 30 in the synchronous signal bit pattern and a part of the following code word has been described in an example of the first synchronous pattern of 13T longer than the maximum run length 11T of the run length restriction rule of the modulation method by 2T. This is not limited. The maximum run length of the first bit pattern may be longer than the maximum run length restriction by 1T or more. The embodiment is effective, particularly when the first bit pattern is longer than the maximum run length by 3T or 4T.

Moreover, the second bit pattern of 4T after the first bit pattern in the synchronous pattern has been described as an example, but this is not limited, and the second bit pattern of 5T or more may be combined. In the embodiment the combination is 13T-4T in consideration of efficiency of the modulation/demodulation method.

Furthermore, as shown in FIG. 14, for the synchronous signal according to the synchronous signal bit pattern, any one of synchronous signal bit patterns SY0 to SY5 is selected, for example, for every 91 code words constituting the code word string of the input data word SCt, and added to the top of 91 code words so that the recording signal corresponding to one synchronous frame is outputted. In this case, as shown in FIG. 14, for the recording signal format per sector, one sector is constituted of 13 rows, and four synchronous frames are allotted to each row in the column direction. The synchronous signal allotted to each synchronous frame is selected from the synchronous signal bit patterns SY0 to SY5 shown in FIG. 12. For example, the synchronous signal bit pattern allotted to the previous synchronous frame of the first row corresponds to the selected SY0. In and after the first row, the synchronous signal bit pattern allotted to the synchronous frame is structured to cyclically repeat like SY1 to SY3 with a row increase. In this case, a difference among SY1 to SY3 is determined by the aforementioned specific code. That is, one of the respective specific codes of the four synchronous signal bit patterns existing in each row is structured to cyclically repeat in response to the row increase.

Here, turning back to FIG. 2, the operation of the 8–15 modulator 12 will be described.

In the 8–15 modulator 12, the synchronous signal and input data word SCt are subjected to the aforementioned DSV control, and the finally outputted synchronous signal and the code word corresponding to the input data word SCt are determined. To facilitate understanding of the description, the DSV control of the input data word SCt will first be described.

When the 8–15 modulator 12 performs the DSV control of the input data word SCt, first the initial coding table (initial value of option of the coding table 123) is selected for the input data word SCt. Subsequently, the 8-bit input data word SCt is inputted, and then the code word option presence/absence detector 121 detects that the output code word corresponding to the present input data word SCt belongs to any one of the first to third modes and has an option for the DSV control, or that the output code word is other than the first to third modes, has no option, and is uniformly determined, based on the present input data word SCt, and the state information determined by the previous output code word (the selected initial value herein) supplied from the coding table address computing portion 122. The detection result is outputted to the coding table address computing portion 122 and absolute value comparing portion 128. Moreover, the coding table address computing portion 122 calculates an address of the coding table 123 in accordance with the detection result of "presence of the option" or "absence of the option" from the code word option presence/absence detector 121.

That is, in the first mode, when the state information supplied from the coding table address computing portion 122 is the state "0", and the input data word SCt is "0" to "38", the code word option presence/absence detector 121 outputs the detection result of "presence of the option". In this case, since two addresses are calculated by the coding table address computing portion 122, the coding table 123 outputs two types of code words by a time division processing or the like. Moreover, the coding table address computing portion 122 reads an output code word OC1t corresponding to the input data word SCt of the coding table of state "0" in the coding tables 123 for a path 1, and reads an output code word OC2t corresponding to the input data word SCt of the coding table of state "3" for a path 2.

Moreover, in the second mode, when the state information supplied from the coding table address computing portion 122 is the state "2", and also when the input data word SCt is "0" to "11" or "26" to "47", the code word option presence/absence detector 121 outputs the detection result of "presence of the option". In this case, the coding table address computing portion 122 reads the output code word OC1t corresponding to the input data word SCt of the coding table of state "2" in the coding tables 123 for the path 1, and reads the output code word OC2t corresponding to the input data word SCt of the coding table of state "4" for the path 2.

Furthermore, in the third mode, when the stage information supplied from the coding table address computing portion 122 is the state "3", the zero run length of the previous output code word on the LSB side is in a range of 2 to 6, the input data word SCt is "156" or less, and the coding rule is not broken even with replacement of the next output code word with the output code word in the coding table of state "0", the code word option presence/absence detector 121 outputs the detection result of "presence of the option". In this case, the coding table address computing portion 122 reads the output code word OC1t corresponding to the input data word SCt of the coding table of state "3" in the coding tables 123 for the path 1, and reads the output code word OC2t corresponding to the input data word SCt of the coding table of state "0" for the path 2.

On the other hand, the code word option presence/absence detector 121 outputs the detection result of "absence of the option" (uniformly determined) to the coding table address computing portion 122 on conditions other than those of the first to third modes. In this case, the coding table address computing portion 122 calculates only one address, and only the output code word OC1t corresponding to the address is read from the coding table address computing portion 122.

Subsequently, with "the presence of the option" matching the first to third modes, the NRZI converter 133 subjects both the output code words OC1t and OC2t to NRZI conversion. On the other hand, with "the absence of the option" other than the first to third modes, only the output code word OC1t is subjected to the NRZI conversion. In this case, when the each of the code words OC1t, OC2t (with "the presence of the output") or the code word OC1t (with "the absence of the output") outputted from the coding table address computing portion 122 is subjected to the NRZI conversion, either an immediately previous code word OC2t-1 or an immediately previous code word OC2t-1, determined by DSV calculation with respect to the code word (OC1t-1, OC2t-1) immediately before the present word as described later, is stored in an internal memory 133A. Therefore, one immediately previous code word stored in the memory 133A is referred to and thereby to perform the NRZI conversion.

Subsequently, as described later in an operation flow, each of the code words OC1t and OC2t-1, or the code word OC1t subjected to the NRZI conversion in the NRZI converter 133 is not immediately stored in the first and second path memories 125, 127. The code word is stored in the first and second path memories 125, 127, after the immediately previous code word is finally determined in accordance with a comparison result of the absolute value of the DSV value with respect to the previous code words calculated in the first and second DSV computing memories 124, 126.

Here, the first and second DSV computing memories 124, 126 compute the DSV values (accumulated value) with respect to the previous code words, and the absolute values of the DSV values are compared by the absolute value comparing portion 128. This case will be described. In the first path memory 125, the immediately previous code word OC1t-1, and all the code words determined before the immediately previous code word OC1t-1 are stored in a time series order in an NRZI converted state, and the code words stored in the first path memory 125 in the time series order are outputted to the first DSV computing memory 124. Similarly, in the second path memory 127, the immediately previous code word OC2t-1, and all the code words determined before the immediately previous code word OC2t-1 are stored in the time series order in the NRZI converted state, and the code words stored in the second path memory 127 in the time series order are outputted to the second DSV computing memory 126. Additionally, when nothing is stored in the first and second path memories 125, 127, 0 is regarded, the processing is performed, and then the code words may successively be accumulated.

Subsequently, the first DSV computing memory 124 computes the DSV value obtained by adding values over the previous code words and the immediately previous code word OC1t-1, and DSV1t-1 is outputted as the result to the absolute value comparing portion 128. Similarly, the second DSV computing memory 126 computes the DSV value obtained by adding values over the previous code words and the immediately previous code word OC2t-1, and DSV2t-1 is outputted as the result to the absolute value comparing portion 128.

Next, the absolute value comparing portion 128 compares a magnitude of an absolute value |DSV1t-1| of the DSV value up to the immediately previous code word OC2t-1 outputted from the first DSV computing memory 124 with that of an absolute value |DSV2t-1| of the DSV value up to the immediately previous code word OC2t-1 outputted from the DSV computing memory 126, and the comparison result is outputted to the memory control/recording signal output portion 129.

Subsequently, when the comparison result sent from the absolute value comparing portion 128 is |DSV1t-1|<|DSV2t-1|, the memory control/recording signal output portion 129 outputs all the previous output code words stored in the first path memory 125, and the immediately previous code word OC1t-1 as the recording signal, and also outputs the signal to the second path memory 127 to rewrite the second path memory 127. Additionally, a storage content of the second DSV computing memory 126 is rewritten into DSV1t-1 which has a smaller absolute value of the DSV value and which is stored in the first DSV computing memory 124.

On the other hand, when the comparison result sent from the absolute value comparing portion 128 is |DSV1t-1|≧|DSV2t-1|, the memory control/recording signal output portion 129 outputs all the previous output code words stored in the second path memory 127, and the immediately previous code word OC2t-1 as the recording signal, and also outputs the signal to the first path memory 125 to rewrite the first path memory 125. Additionally, the storage content of the first DSV computing memory 124 is rewritten into DSV2t-1 which has a smaller absolute value of the DSV value and which is stored in the second DSV computing memory 126.

Therefore, the absolute value comparing portion 128 selects the immediately previous code word which has a smaller absolute value of the DSV value, and a code word string in which the previous output code words are combined with the selected immediately previous code word is outputted to the recording driving circuit 13 (FIG. 1) from the memory control/recording signal output portion 129.

Thereafter, with "the presence of the option", the NRZI converter 133 stores the respective signals obtained by the NRZI conversion of the output code words OC1t, OC2t in the first and second path memories 125, 127, respectively. On the other hand, with "the absence of the option", the signal obtained by the NRZI conversion of only the output code word OC1t is stored in both the first and second path memories 125, 127. Accordingly, the respective signals stored in the first and second path memories 125, 127 are immediately before code words OC1t+t, OC2t+1 corresponding to input data word SCt+1 to be coded next during the DSV control. Moreover, when the respective signals stored in the first and second path memories 125, 127 are substantially similarly subjected to DSV computing and stored in the first and second DSV computing memories 124, 126, the signals are used in comparing the absolute values of the DSV values during the next operation.

The aforementioned operation is repeated until the input data word SCt is eliminated. After the NRZI conversion, the recording signal which satisfies the run length restriction rule of 3T to 11T and which is DSV controlled can be outputted as the recording signal to the recording medium 20.

On the other hand, the input data word SCt is also inputted into the synchronous frame final data detector 130. The synchronous frame final data detector 130 counts the number of input data words SCt (the synchronous frame is constituted of 91 code words), judges whether or not the input data word SCt is final data of the synchronous frame, and outputs the detection result for inserting the synchronous signal to the synchronous signal table address computing portion 131.

Moreover, when the input data word SCt is detected to be the final data of the synchronous frame, and the synchronous signal is inserted, the synchronous signal table address computing portion 131 selects any one of five synchronous signal bit patterns SY0 to SY5 in any one of the synchronous signal tables of states "0" to "5" based on the state information determined by the preceding output code word (the initial value of the initial table herein) supplied from the coding table address computing portion 122 and the information indicating any one of five synchronous signal bit patterns SY0 to SY5 held in the synchronous signal table address computing portion 131. Here, the addresses of two synchronous signal bit patterns SYn-1t, SYn-2t (n is 0 to 5) which correspond to the type selected from SY0 to SY5 and which are different in the even/odd relation from each other are calculated. The synchronous signal table 132 outputs the synchronous signal having two different bit patterns to the NRZI converter 133. Moreover, the NRZI converter 133 subjects two synchronous signals outputted from the synchronous signal table 132 to the NRZI conversion.

Thereafter, by a procedure similar to the procedure with the code word, the absolute values of the DSV values are compared with each other with respect to the immediately previous code word computed by the first and second DSV computing memories 124, 126. After the comparison result of the absolute values of the DSV values is obtained, and the immediately previous code word is determined, two synchronous signals outputted from the NRZI converter 133 are stored in the first and second path memories 125, 127. Moreover, the respective synchronous signals stored in the first and second path memories 125, 127 are subjected to DSV computation and stored in the first and second DSV computing memories 124, 126 similarly as described above, and are used for comparison of the absolute values of the DSV values during the next operation.

In this case, with first insertion of the synchronous signal, it may be assumed that the immediately previous code word is not stored in the first and second path memories 125, 127.

In this case, at the time when the following input data word SCt results in "the presence of the option" after the synchronous signal is inputted, the absolute values of the DSV values immediately before including the synchronous signal are compared, and the synchronous signal relating with the smaller absolute value of the DSV values immediately before including the synchronous signal is determined. Moreover, the synchronous signal is inserted, for example, into every 91 pieces of word data.

Additionally, the first and second path memories are disposed in the 8–15 modulator 12 in order to temporarily store the synchronous signal and code word string, but the present invention can also be applied even if more path memories are disposed.

Figure 15:
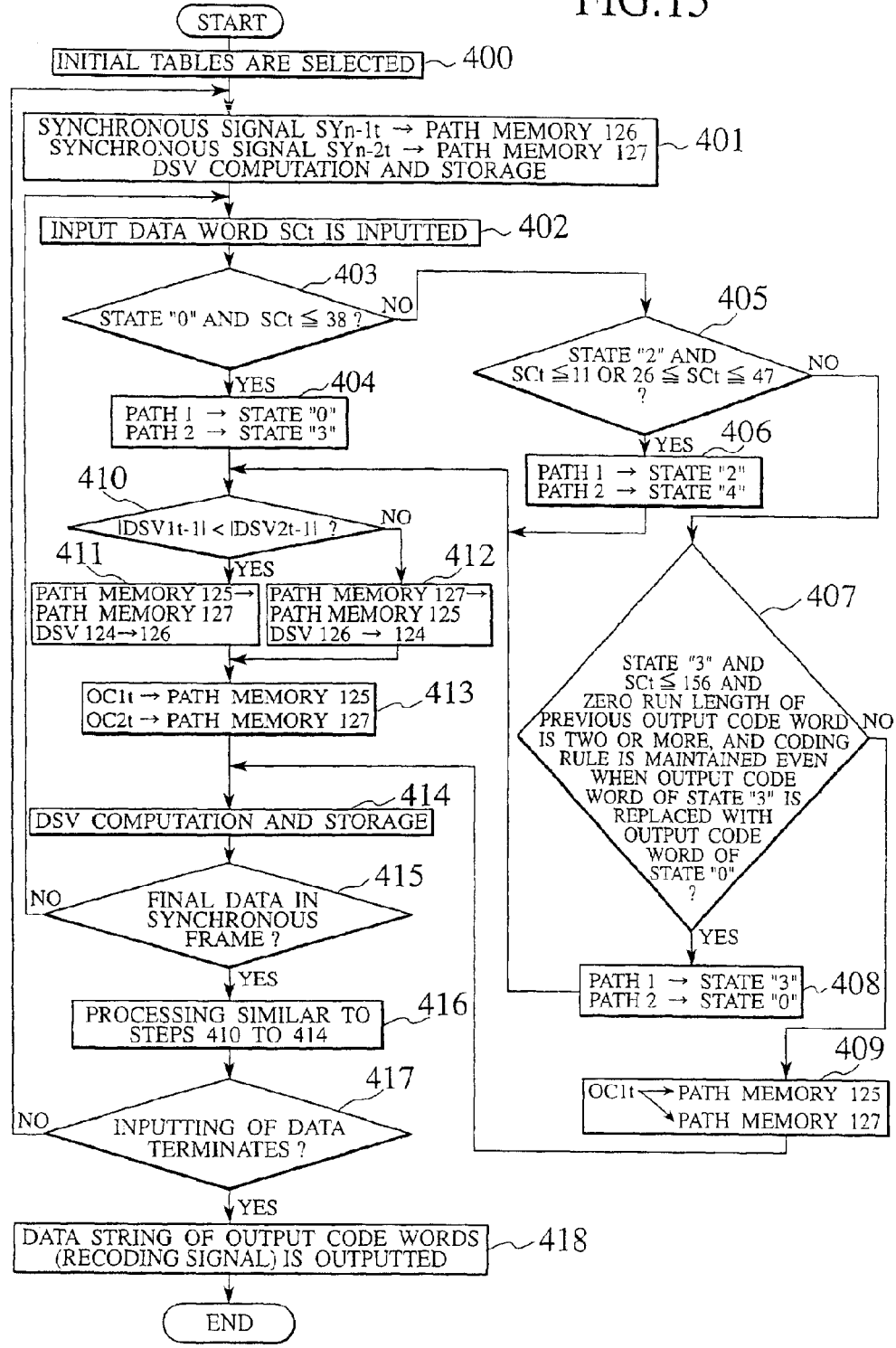
FIG. 15 is a flowchart of DSV control at a time of 8–15 modulation.

A concrete example of the operation will next be described in detail with reference to the DSV control flowchart of the 8–15 modulation time shown in FIG. 15, and FIG. 2.

First in step 400, the initial tables (the initial values of the option of the synchronous signal table 132 and coding table 123) are selected with respect to the synchronous signal and the input data word SCt.

Subsequently, in step 401, the synchronous signal table address computing portion 131 selects any one of SY0 to SY5 in any one of the synchronous signal tables of states "0" to "5" based on the state determined by the preceding output code word (the selected initial value for the first case) supplied from the coding table address computing portion 122 and the information indicating any one of five synchronous signal bit patterns SY0 to SY5 held in the synchronous signal table address computing portion 131. For example, the synchronous signal bit pattern SYn (n is 0 to 5) in the synchronous signal table of state "n" (n is 0 to 5) is selected. The synchronous signal bit pattern SYn holds two synchronous signal bit patterns SYn-1t, SYn-2t (n is 0 to 5) whose polarities differ from each other after the NRZI conversion because of the different even/odd relation with respect to the number of "1". Therefore, the NRZI converter 133 converts the two synchronous signal bit patterns SYn-1t, SYn-2t into NRZI, respectively. Thereafter, as described above, the absolute values of the DSV values are compared up to both the immediately previous code words (there is no immediately previous code word with a first synchronous signal), and an either immediately previous code word is determined. Thereafter, two synchronous signals SYn-1t, SYn-2t subjected to the NRZI conversion in the NRZI converter 133 are outputted to the first and second path memories 125, 127, the DSV values including the synchronous signal SYn-1t are computed and stored in the first DSV computing memory 124, and the DSV values including the synchronous signal SYn-2t are computed and stored in the second DSV computing memory 126.

Next in step 402, following the synchronous signal, the 8-bit input data word SCt is inputted.

Subsequently, in steps 403, 405, 407, the code word option presence/absence detecting circuit 121 judges that the present input data word SCt is univocally determined or that there is an option, based on the present input data word SCt, and the state determined by the preceding output code word (the selected initial value for the first case) supplied from the coding table address computing portion 122. The detection result is outputted to the coding table address computing portion 122 and absolute value comparing portion 128.

That is, in step 403, as described in the coding table shown in FIGS. 3, 9, the coding tables of states "0" and "3" are noted. According to the first mode, even when the respective output code words of the coding table of state "0" corresponding to the input data words "0" to "38" are replaced with the output code words of the coding table of state "3" corresponding to the input data words "0" to "38", the coding rule can be maintained, and the decoding is possible. Therefore, in this step, the code word option presence/absence detecting circuit 121 judges whether or not there is the option according to the first mode.

Moreover, when the state supplied from the coding table address computing portion 122 is "0", and the input data word SCt is "38" or less, namely the condition is matched (Yes), the code word option presence/absence detecting circuit 121 outputs the detection result of "the presence of the option", and the flow shifts to step 404. On the other hand, when the state is not "0", or the input data word SCt is not "38" or less, namely the condition is not matched (No), the flow shifts to step 405.

Subsequently, in step 404, according to the result of "the presence of the option" of step 403, the coding table address computing portion 122 reads the output code word OC1t corresponding to the input data word SCt of the table of state "0" for the path 1 from the coding table 123, and the output code word OC2t corresponding to the input data word SCt of the table of state "3" for the path 2, and the NRZI converter 133 subjects the output code words OC1t, OC2t to the NRZI conversion, respectively.

On the other hand, in step 405, the coding tables of states "2" and "4" are noted from the mismatched result by the step 403. According to the second mode, even when the respective output code words of the coding table of state "2" corresponding to the input data words "0" to "11" and "26" to "47" are replaced with the output code words of the coding table of state "4" corresponding to the input data words "0" to "11" and "26" to "47", the coding rule can be maintained, and the decoding is possible. Therefore, in this step, the code word option presence/absence detecting circuit 121 judges whether or not there is the option according to the second mode.

Moreover, the code word option presence/absence detecting circuit 121 judges whether or not the state supplied from the coding table address computing portion 122 is "2", and the input data word SCt is in a range of "11" or less or "26" to "47". When the condition is matched (Yes), the detection result of "the presence of the option" is outputted, and the flow shifts to step 406. On the other hand, when the condition is not matched (No), the flow shifts to step 407.

Subsequently, in step 406, according to the result of "the presence of the option" of step 405, the coding table address computing portion 122 reads the output code word OC1t corresponding to the input data word SCt of the table of state "2" from the coding table 123, and the output code word OC2t corresponding to the input data word SCt of the table of state "4", and the NRZI converter 133 subjects the output code words OC1t, OC2t to the NRZI conversion, respectively.

Subsequently, in step 407, from the mismatched result by the step 405, according to the third mode, with the coding table of state "3", the zero run length of the previous output code word on the LSB side is in a range of 2 to 6 (2 or more is shown in the flow), and the input data word SCt is "156" or less, and even the next output code word is replaced with the output code word in the coding table of state of "0", the coding rule is not broken. In this case, even when the output code word of state "3" is replaced with the output code word of state "0", the coding rule can be maintained, and the decoding is possible. Therefore, in this step, the code word option presence/absence detecting circuit 121 judges whether or not there is the option according to the third mode.

Accordingly, it is judged whether or not the zero run length of the previous output code word on the LSB side is 2 or more, the input data word SCt is "156" or less, the next output code word is selected from the coding table of state "3", and the coding rule is not broken even with replacement with the output code word in the coding table of state "0". When the condition is matched (Yes), the detection result of "the presence of the option" is outputted, and the flow shifts to step 408. On the other hand, when the condition is not matched (No), "the absence of the option" can be judged up to this step via the steps 403, 405. Therefore, the detection result of "the absence of the option" is outputted, and the flow shifts to step 409. Additionally, upon judging "the absence of the option" in step 407, without comparing the absolute values of the DSV values or selecting the path, only accumulation into the first and second path memories 125, 127 and DSV calculation updating in the first and second DSV computing memories 124, 126 are performed, until "the presence of the option" results.

In this case, in the embodiment, the run length restriction rule RLL (d, k)=RLL (2, 10) is set to be satisfied in the step 407. When the run length restriction rule RLL (d, k) is changed to RLL (2, 11), RLL (2, 12), or RLL (2, 13) in the step 407, the minimum run length of 3T, and the maximum run length of 12T, 13T, or 14T can partially be realized excluding the conditions of the steps 403, 405.

Subsequently, in step 408, according to the result of "the presence of the option" by the step 407, the coding table address computing portion 122 reads the output code word OC1t corresponding to the input data word SCt of the table of state "3" from the coding table 123, and the output code word OC2t corresponding to the input data word SCt of the table of state "0", and the NRZI converter 133 subjects the output code words OC1t, OC2t to the NRZI conversion, respectively.

Next in step 409, since "the absence of the option" is judged in the step 407, without comparing the absolute values of the immediately previous DSV values, according to the result of "the absence of the option", only the output code word OC1t corresponding to the input data word SCt is read from the coding table 123, the NRZI converter 133 subjects only the output code word OC1t to the NRZI conversion, and the signals obtained by converting only the output code word OC1t into NRZI are stored in both the first and second path memories 125, 127. In this case, the output code words OC1t, OC2t of the paths 1, 2 have the same value. Thereafter, the flow shifts to step 414, and a processing of steps 414 and 415 is performed.

Next in step 410, the respective signals obtained by subjecting the output code words OC1t, OC2t to the NRZI conversion by the NRZI converter 133 in the step 404, 406, or 408 are not stored in the first and second path memories 125, 127. In this state, the absolute values |DSV| of the respective DSV values obtained by subjecting up to the immediately previous code word stored in the first and second DSV computing memories 124, 126 to the DSV computation are compared by the absolute value comparing portion 128. Here, with the code word following the synchronous signal, the absolute values of the respective DSV values computed in the step 401 are compared with each other. With the output code words OC1t, OC2t, the absolute values of the respective DSV values computed by considering up to immediately previous values and stored in step 414 described later at the previous loop are compared with each other.

Here, when the absolute value |DSV1t-1| of DSV1t-1 from the first DSV computing memory 124 is smaller than the absolute value |DSV2t-1| of DSV2t-1 from the second DSV computing memory 126 (Yes), the previous output code words accumulated in the first path memory 125 are outputted to the second path memory 127 to rewrite the second path memory 127 in step 411. Additionally, the second DSV computing memory 126 is rewritten with DSV1t-1 stored in the first DSV computing memory 124 (the content of the second DSV computing memory 126 is changed to DSV1t-1). On the other hand, when the absolute value |DSV2t-1| of DSV2t-1 from the second DSV computing memory 126 is smaller or the same (No), the previous output code words accumulated in the second path memory 127 are outputted to the first path memory 125 to rewrite the first path memory 125 in step 412. Additionally, the first DSV computing memory 124 is rewritten with DSV2t-1 stored in the second DSV computing memory 126 (the content of the first DSV computing memory 124 is changed to DSV2t-1).

Subsequently, after the steps 411 and 412, in step 413, the respective signals obtained by subjecting the output code words OC1t, OC2t to the NRZI conversion by the NRZI converter 133, that is, the signal corresponding to the output code word OC1t of the path 1, and the signal corresponding to the output code word OC2t of the path 2 are additionally stored in the first and second path memories 125, 127, respectively.

Subsequently, in step 414, the DSV value including the output code word OC1t of the path 1 is computed and stored in the first DSV computing memory 124, and the DSV value including the output code word OC2t of the path 2 is computed and stored in the second DSV computing memory 126. Here, the respective DSV values stored in the first and second DSV computing memories 124, 126 are used for comparison of the absolute values of the respective DSV values computed by considering up to immediately previous values, in step 410 during the operation steps for the next code word.

Next in step 415, when the synchronous frame final data detector 130 does not judge that the input data word SCt is final data in the synchronous frame (No), then, returning to the step 402, the steps 402 to 415 are repeated. On the other hand, it is judged that the input data word SCt is the final data in the synchronous frame (Yes), and then in step 416 the synchronous signal bit patterns SYn-1t, SYn-2t are subjected to a processing similar to the processing of the steps 410 to 414.

Next in step 417, when inputting of the next input data word SCt does not terminate (No), the flow returns to the step 401. On the other hand, when inputting of the next input data word SCt terminates (Yes), the data string of the output code words stored in the first path memory 125 (or the second path memory 127) is outputted to the recording driving circuit (FIG. 1) from the memory control/recording signal output portion 129 in step 418.

Moreover for the 15-bit recording signal coded in this manner, the synchronous signal is inserted into every predetermined number of code words (e.g., every 91 code words). The run length restriction rule in which the minimum run length excluding the synchronous signal is 3T (T=period of channel bit) and the maximum run length is 11T is satisfied. The coding rate is raised, and the recording in the recording medium 20 such as the optical disk and magnetic disk at the high density can be realized.

Additionally, the synchronous signal generating method of the present invention is effective in using different DSV control methods. For example, the synchronous signal generating method of the present invention may be applied to a method of not replacing the codes of the tables even if the coding tables in the present embodiment are used, and inserting a DSV control bit for each specific period to perform the DSV control.

<Transmitting apparatus and Medium>

Figure 16:
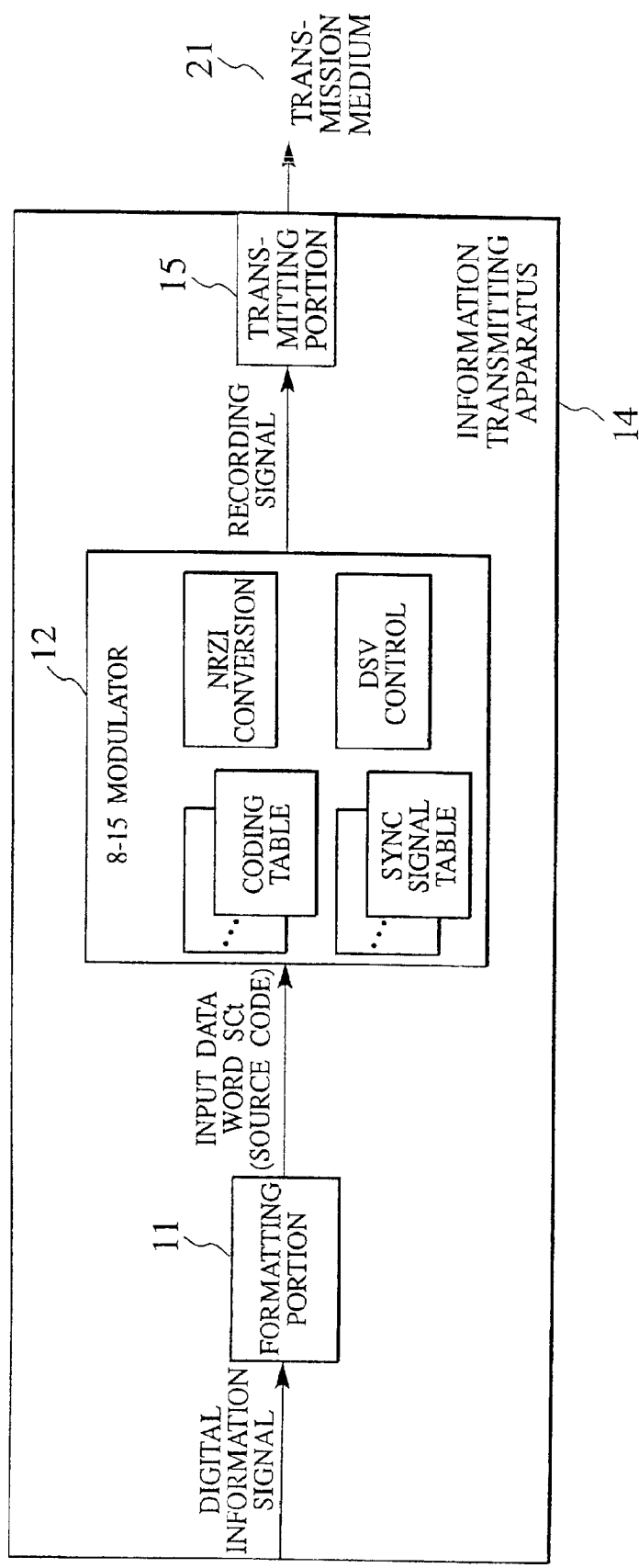
FIG. 16 is a block diagram showing an information transmitting apparatus in an embodiment of a synchronous signal generating method and a transmitting apparatus according to the present invention.

FIG. 16 is a block diagram showing an information transmitting apparatus to which one embodiment of a synchronous signal generating method and a transmitting apparatus according to the present invention is applied.

As shown in FIG. 16, an information transmitting apparatus 14 to which one embodiment of the synchronous signal generating method and transmitting apparatus according to the present invention is applied is generally constituted of a formatting portion 11, 8–15 modulator 12, and transmitting portion 15. The digital signal relating to the information such as an inputted image and sound is 8–15 modulated by the 8–15 modulator 12 via the formatting portion 11, and the 8–15 modulated signal is transmitted via radio or a cable from the transmitting portion 15, so that a transmission medium 21 according to the present invention is obtained.

In this case, the information transmitting apparatus (transmitting apparatus) 14 is the same as the disk recording apparatus (recording apparatus) 10 in the formatting portion 11 and 8–15 modulator 12, and is different only in the transmitting portion 15. Here, during transmission of the signal 8–15 modulated in the 8–15 modulator 12 in air (radio) or via a transmission cable (wire) from the transmitting portion 15, when conversion suitable for transmission is performed in the transmitting portion 15, a small data amount can be transmitted with a raised coding rate and without any error.

According to the synchronous signal generating method, recording apparatus, transmitting apparatus, recording medium, and transmission medium of the present invention as described above, digital data is held in sectors of a plurality of synchronous frames at an increased coding rate with a density increased to be transmitted successively, in which the synchronous frame consists of a synchronous signal and a code word string satisfying restrictions on minimum run length and maximum run length, the synchronous signal being separable from the code word string satisfying the predetermined run length restriction rule and being constituted with a specific code for identifying the position in one sector and a synchronous pattern consisting of a first bit pattern of a run length longer than the maximum run length of the predetermined run length restriction rule by 1T (T is a period of channel bit of the code word) and a second bit pattern of a run length longer than the minimum run length, following the first bit pattern, so that even if each edge of the signal consisting of the synchronous signal and the code word string is shifted by 1T due to the effect of interference between codes, both can be identified correctly to be detected.

Since the synchronous signal includes a specific code for identifying the position in a sector and enabling DC control, if a synchronous signal at the head of a sector cannot temporarily be read on an optical disk of higher density, or another one is erroneously identified as the sector head, a correct sector head can be predicted based on a synchronous signal being present thereafter, which enables good reproduction of digital data.

It should be understood that many modifications and adaptations of the invention will become apparent to those skilled in the art and it is intended to encompass such obvious modifications and changes in the scope of the claims appended hereto.

What is claimed is:

1. A synchronous signal generating method in which a plurality of coding tables is used to subject input data words of p-bits to modulation and to thereby obtain words of q-bits (q>p), said plurality of coding tables storing the code words corresponding to respective input data words, and to state information indicating the coding table for use in modulating a next input data word to obtain a next code word satisfying a predetermined run length restriction rule even with the next code word coupled directly with the code word, the method comprising:

generating a synchronous signal for decoding reproducing data, that is separable from a string of code words satisfying said predetermined run length restriction rule, and comprises a specific code for identifying a position in one sector and a synchronous pattern comprising a first bit pattern of a run length longer than a maximum run length in said predetermined run length restriction rule by 1T or more (T is a period of channel bit of the string of code words) and a following second bit pattern of a run length longer than a minimum run length, and said synchronous pattern including part of a following code word; and inserting said synchronous signal into every predetermined number of code words in said string of code words satisfying said predetermined run length restriction rule to generate a synchronous frame.

2. A synchronous signal generating method according to claim 1, wherein a specific coding table and another specific coding table of said plurality of coding tables are allotted to have an even/odd relation such that the number of "1"s in each of the code words stored corresponding to the respective predetermined input data words is even in the specific coding table and the number of "1" in the code word is odd in the other specific coding table so as to enable a DSV control, and when said predetermined input data word is modulated, the code word having a smaller absolute value is selected from an absolute value of a DSV value obtained from the code word using said specific coding table, and an absolute value of a DSV value obtained from the code word modulated using said other specific coding table, and a synchronous signal for decoding reproducing data is inserted into every predetermined number of code words in a string of the code words satisfying said predetermined run length restriction rule while the DSV control is performed, so as to generate the synchronous frame.

3. A synchronous signal generating method according to claim 1, wherein a plurality of synchronous signal tables is prepared corresponding to said plurality of coding tables, and a plurality of synchronous signal bit patterns for generating said synchronous signal is set in each of said synchronous signal tables, each of said synchronous signal bit pattern having two bit patterns in even/odd relation such that the number of "1" is even in one pattern and is odd in the other pattern to allow selection therebetween by a DSV control.

4. A synchronous signal generating method according to claim 1, wherein said p bit is 8 bit, said q bit is 15 bit, and said run length restriction rule sets a minimum run length of a signal of the code words subjected to NRZI conversion at 3T without said synchronous signal and a maximum run length at one of 11T, 12T, 13T and 14T.

5. A recording apparatus comprising:
a modulating unit for modulating input data words of p-bits to obtain code words of q-bits (q>p) by referring to a plurality of coding tables storing the code words corresponding to respective input data words, and to state information indicating the coding table for use in modulating a next input data word to obtain a next code word satisfying a predetermined run length restriction rule even with the next code word coupled directly with the code word;
a synchronous signal generation unit for generating a synchronous signal for decoding reproducing data, that is separable from a string of code words satisfying said predetermined run length restriction rule, and comprises a specific code for identifying a position in one sector and a synchronous pattern comprising a first bit pattern of a run length longer than a maximum run length in said predetermined run length restriction rule by 1T or more (T is a period of channel bit of the string of code words) and a following second bit pattern of a run length longer than a minimum run length, said synchronous pattern including part of a following code word;
a synchronous frame generation unit for inserting said synchronous signal into every predetermined number of code words in said string of code words satisfying said predetermined run length restriction rule to generate a synchronous frame; and
a recording unit for sequentially recording a recording signal based on said synchronous frame in a recording medium.

6. A recording apparatus according to claim 5,
wherein a specific coding table and another specific coding table of said plurality of coding tables are allotted to have an even/odd relation such that the number of "1"s in each of the code words stored corresponding to respective predetermined input data words is even in a specific coding table and the number of "1"s in the code word is odd in another specific coding table so as to enable a DSV control, and said modulating unit selects the code word having a smaller absolute value from an absolute value of a DSV value obtained from the code word using said specific coding table, and an absolute value of a DSV value obtained from the code word modulated using said another specific coding table, and said synchronous frame generation unit inserts said synchronous signal for decoding reproducing data into every predetermined number of code words in a string of the code words satisfying said predetermined run length restriction rule while the DSV control is performed.

7. A transmitting apparatus comprising:
a modulating unit for modulating an input data word of p-bits to obtain a code word of q-bits (q>p) plurality of coding tables storing the code words corresponding to respective input data words, and to state information indicating the coding table for use in modulating a next input data word to obtain a next code word satisfying a predetermined run length restriction rule even with the next code word coupled directly with the code word;
a synchronous signal generation unit for generating a synchronous signal for decoding reproducing data, that is separable from a string of code words satisfying said predetermined run length restriction rule, and comprises a specific code for identifying a position in one sector and a synchronous pattern comprising a first bit pattern of a run length longer than a maximum run length in said predetermined run length restriction rule by 1T or more (T is a period of channel bit of the string of code words) and a following second bit pattern of a run length longer than a minimum run length, and said synchronous pattern including part of a following code word;
a synchronous frame generation unit for inserting said synchronous signal into every predetermined number of code words in said string of code words satisfying said predetermined run length restriction rule to generate a synchronous frame; and
a transmitting unit for sequentially transmitting a recording signal based on said synchronous frame by wire or radio.

8. A transmitting apparatus according to claim 7,
wherein a specific coding table and another specific coding table of said plurality of coding tables are allotted to have an even/odd relation such that the number of "1"s in each of the code words stored corresponding to a respective predetermined input data words is even in the specific coding table and the number of "1"s in the code word is odd in another specific coding table so as to enable a DSV control, and said modulating unit selects the code word having a smaller absolute value from an absolute value of a DSV value obtained from the code word using said specific coding table, and an absolute value of a DSV value obtained from the code word modulated using said another specific coding table, and said synchronous frame generation unit inserts said synchronous signal for decoding reproducing data into every predetermined number of code words in a string of the code words satisfying said predetermined run length restriction rule while the DSV control is performed.

9. A recording medium which is recorded using the synchronous signal generating method according to claim 1.

10. A transmission medium which is transmitted using the synchronous signal generating method according to claim 1.

* * * * *